(12) United States Patent
Bonet Zordan et al.

(10) Patent No.: US 9,147,498 B2
(45) Date of Patent: Sep. 29, 2015

(54) CIRCUIT ARRANGEMENT, A METHOD FOR TESTING A SUPPLY VOLTAGE PROVIDED TO A TEST CIRCUIT, AND A METHOD FOR REPAIRING A VOLTAGE SOURCE

(71) Applicants: Leonardo Henrique Bonet Zordan, Montpellier (FR); Alberto Bosio, Montpellier (FR); Patrick Girard, Villetelle (FR); Nabil Badereddine, Grasse (FR)

(72) Inventors: Leonardo Henrique Bonet Zordan, Montpellier (FR); Alberto Bosio, Montpellier (FR); Patrick Girard, Villetelle (FR); Nabil Badereddine, Grasse (FR)

(73) Assignees: INTEL DEUTSCHLAND GMBH, Neubiberg (DE); CENTRE NATIONAL DE LA RECHERCHE SCIENTIFIQUE (CNRS), Paris (FR); UNIVERSITE DE MONTPELLIER 2, Montpellier (FR)

( * ) Notice: Subject to any disclaimer, the term of this patent is extended or adjusted under 35 U.S.C. 154(b) by 124 days.

(21) Appl. No.: 13/862,513

(22) Filed: Apr. 15, 2013

(65) Prior Publication Data

US 2014/0307515 A1    Oct. 16, 2014

(51) Int. Cl.
| | |
|---|---|
| G11C 11/00 | (2006.01) |
| G11C 29/02 | (2006.01) |
| G11C 29/44 | (2006.01) |
| G11C 11/41 | (2006.01) |

(52) U.S. Cl.
CPC ............ *G11C 29/021* (2013.01); *G11C 29/028* (2013.01); *G11C 29/4401* (2013.01); *G11C 11/41* (2013.01)

(58) Field of Classification Search
CPC ........ G11C 11/00; G11C 29/44; G11C 11/41; G11C 11/412; G11C 11/413; G11C 11/417; G11C 29/50; G11C 29/50016; G11C 7/24; G11C 29/41; G11C 29/4401; G11C 29/028; G11C 29/021
USPC ................ 365/154, 230.01, 201, 156, 189.09
See application file for complete search history.

(56) References Cited

U.S. PATENT DOCUMENTS

| | | | | |
|---|---|---|---|---|
| 5,910,922 | A * | 6/1999 | Huggins et al. | 365/201 |
| 6,778,450 | B2 * | 8/2004 | Selvin et al. | 365/201 |
| 2008/0298152 | A1 * | 12/2008 | Ito et al. | 365/222 |
| 2013/0003442 | A1 * | 1/2013 | Asthana | 365/154 |
| 2013/0019133 | A1 * | 1/2013 | Zhang et al. | 714/721 |
| 2014/0173317 | A1 * | 6/2014 | Shamanna et al. | 713/340 |

OTHER PUBLICATIONS

"A Built-in Scheme for Testing and Repairing Voltage Regulators of Low-Power SRAMs", L.B. Zordan, A. Bosio, L. Dilillo, P. Girard, A. Todri, A. Virazel, N. Badereddine; LIRMM—Université Montpellier II / CNRS; Version 3; May 18, 2011; p. 7-13.
"Test Solution for Data Retention Faults in Low-Power SRAMs", L.B. Zordan, A. Bosio, L. Dilillo, P. Girard, A. Todri, A. Virazel, N. Badereddine; LIRMM—Université Montpellier II / CNRS; Version 3; May 18, 2011; p. 14-21.

* cited by examiner

*Primary Examiner* — J. H. Hur
*Assistant Examiner* — Xiaochun L Chen

(57) ABSTRACT

A circuit arrangement may include: a memory, composed of a memory cell array, including a plurality of memory cells, and a peripheral circuitry; a voltage source configured to provide at least one supply voltage; a test circuit integrated with the memory cell array and the voltage source, wherein the test circuit receives the supply voltage; the test circuit including: at least one test memory cell; at least one failure detection circuit configured to detect a data retention failure in the at least one test memory cell.

17 Claims, 14 Drawing Sheets

TEST RESULTS ACCORDING TO DRF_MOCK1 AND DRF_MOCK2

| DRF_Mock1 | DRF_Mock2 | Test Result | Description |
|---|---|---|---|
| '0' | '0' | FAIL | Vreg is higher than Vreg_UB |
| '0' | '1' | PASS | Vreg is within the predefined range |
| '1' | '0' | FAIL | Invalid result |
| '1' | '1' | FAIL | Vreg is lower than Vreg_LB |

US 9,147,498 B2

CIRCUIT ARRANGEMENT, A METHOD FOR TESTING A SUPPLY VOLTAGE PROVIDED TO A TEST CIRCUIT, AND A METHOD FOR REPAIRING A VOLTAGE SOURCE

TECHNICAL FIELD

Various aspects relate to a circuit arrangement, a method for testing a supply voltage provided to a test circuit, and a method for repairing a voltage source.

BACKGROUND

A voltage regulation system may offer an efficient mechanism for reducing static power consumption of a memory device (e.g. a static random access memory). When the memory is not accessed for a long period of time, it may switch to an intermediate low-power mode. In this mode, a voltage regulator of the voltage regulation system may be used to reduce the voltage supplied to the memory cells of the memory cell array. The voltage supplied to the memory cells may be a voltage that may be as low as possible, whilst preventing data loss.

Since retention of data in the memory cell array and acceptable levels of static power savings, when the memory is switched into low-power mode, may depend on the voltage supplied to the memory cell array by a voltage regulator, a reliable operation of the voltage regulator should be ensured. Accordingly, there may be a need for adequate test techniques for the voltage regulator. Furthermore, there may be a need to implement such test techniques whilst minimizing chip area. In other words, a test circuit that may be used for the test technique may need to have a low area overhead. Even futher, there may be a need to repair a voltage regulator in case it is determined that the voltage supplied to the memory cell array by the voltage regulator is not in a range of values that may prevent data loss in the memory cell array and that may ensure acceptable levels of static power savings.

SUMMARY

A circuit arrangement is provided, which may include: a memory having a memory cell array including a plurality of memory cells; a voltage source configured to provide at least one supply voltage; a test circuit integrated with the memory cell array and the voltage source, wherein the test circuit receives the supply voltage; the test circuit including: at least one test memory cell; at least one failure detection circuit configured to detect a data retention failure in the at least one test memory cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
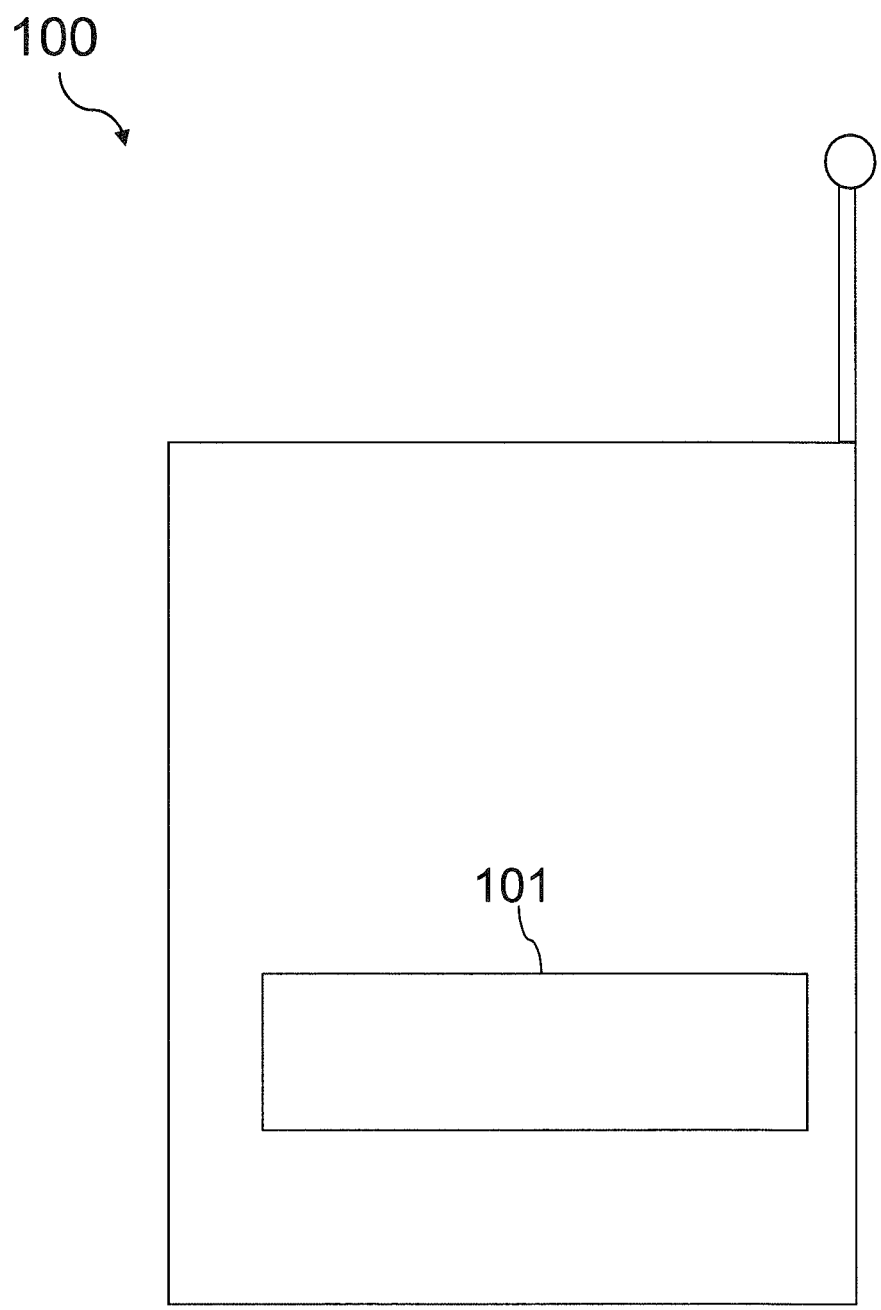
FIG. 1A shows a device that may include at least one circuit and/or circuit arrangement.

The following detailed description refers to the accompanying drawings that show, by way of illustration, specific details and aspects in which the invention may be practised. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

With a growing demand for high performance, multi-functional devices (e.g. mobile devices in a communications technology), power consumption has emerged as a major design concern for a circuit and/or a circuit arrangement that may be included in a high performance, multi-functional device. Simultaneously, technology scaling may be shrinking device dimensions and/or lowering power supply and/or threshold voltages of a circuit and/or circuit arrangement that may be included in a high performance, multi-functional device.

The lowering of power supply and/or threshold voltages may cause an increase of leakage currents. Power consumption due to leakage currents (which may also be referred to as "static power consumption") may be a major contributor to the total power consumption in a circuit and/or circuit arrangement that may be included in a high performance, multi-functional device.

With technological advancements, a circuit and/or circuit arrangement that may have been previously placed on a printed circuit board, may currently be embedded with or within a chip (or die), for example, in a system-on-chip (SOC) package. The embedded circuit and/or circuit arrangement (e.g. in an SOC package) may allow further shirinking of device dimensions.

FIG. 1A shows a device 100 that may include at least one circuit and/or circuit arrangement 101.

The device 100 may include, or may be, at least one of a communications device (e.g. a wired and/or wireless communications device), a mobile computing device (e.g. a personal digital assistant (PDA)), a media playing device, a portable gaming device, a personal computer, and a laptop computer, although other devices may be possible as well. For example, the device 100 may be identified with the high performance, multi-functional device introduced in the description above.

The at least one circuit and/or circuit arrangement 101 may include, or may be, a circuit and/or a circuit arrangement that may be embedded with or within a chip (or die) (e.g. in an SOC package).

The at least one circuit and/or circuit arrangement 101 may include a memory cell array (e.g. at least one memory cell array). The at least one circuit and/or circuit arrangement 101 may include a voltage source that may, for example, be configured to provide a supply voltage (e.g. to a memory cell array).

Figure 1B:
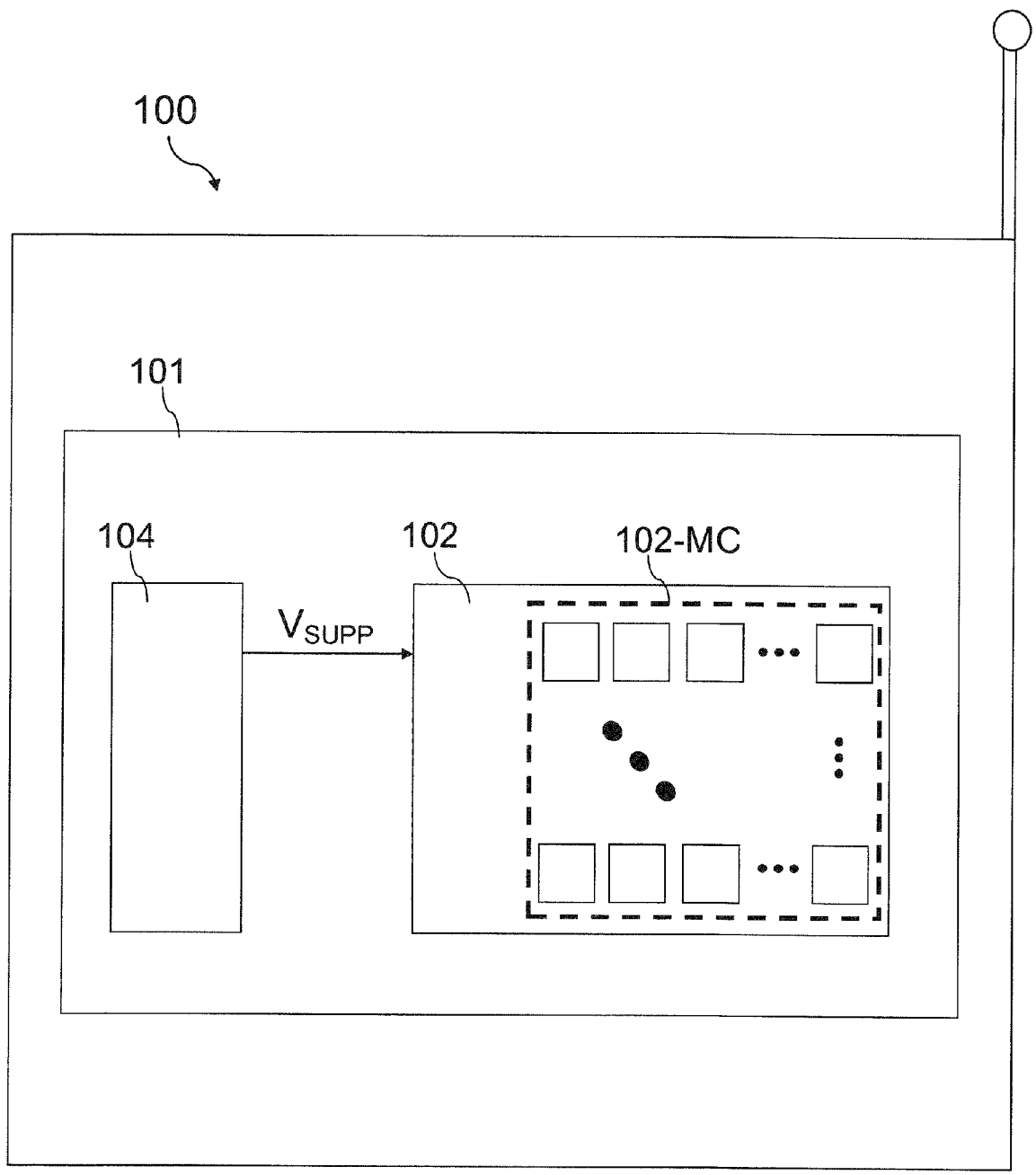
FIG. 1B shows a block diagram of the at least one circuit and/or circuit arrangement of the device shown in FIG. 1A, which may include a memory cell array and a voltage source.

FIG. 1B shows a block diagram of the at least one circuit and/or circuit arrangement 101 of the device 100, which may include a memory cell array 102 and a voltage source 104.

The memory cell array 102 may include a plurality of memory cells 102-MC. The plurality of memory cells 102-MC may include, or may be, a volatile memory cell, for example, a random access memory (RAM) cell, such as a dynamic random access memory (DRAM) cell, and a static random access memory (SRAM) cell (e.g. a low power SRAM cell), although other types of volatile memory cells may be possible as well.

The plurality of memory cells 102-MC may include, or may be, a non-volatile memory cell, for example, a read only memory (ROM) cell, such as an erasable programmable read only memory (EPROM) cell, and an electronically erasable programmable read only memory (EEPROM) cell, although other types of non-volatile memory cells may be possible as well.

The memory cell array 102 may include, or may be, at least one of a volatile memory cell array (e.g. RAM cell array, e.g. SRAM cell array, e.g. low power SRAM cell array) and a non-volatile memory cell array (e.g. ROM cell array).

As described above, the at least one circuit and/or circuit arrangement 101 may be embedded with or within a chip (or die) (e.g. in an SOC package). Consequently, the memory cell array 102 shown in FIG. 1B may be embedded with or within a chip (or die) (e.g. in an SOC package).

The memory cell array 102 including the plurality of memory cells 102-MC may have a dense architecture, and may, for example, account for more than 90% of the chip area according to ITRS (International Technology Roadmap for Semiconductors) roadmap 2011. In other words, the memory cell array 102 may have a high area overhead. The high area overhead incurred by the memory cell array 102 may imply that the memory cell array 102 may be a main contributor to a total static power consumption of the chip (or die) (e.g. an SOC package). Furthermore, the dense architecture of the plurality of memory cells 104-MC may make the memory cell array 102 (e.g. SRAM cell array) vulnerable to physical defects.

The voltage source 104 of the at least one circuit and/or circuit arrangement 101 shown in FIG. 1B may be configured to provide at least one supply voltage $V_{SUPP}$ to the memory cell array 102 (e.g. SRAM cell array).

The voltage source 104 may be configured to regulate the at least one supply voltage $V_{SUPP}$ provided to the memory cell array 102. For example, the at least one supply voltage $V_{SUPP}$ may be at least substantially equal to a nominal supply voltage $V_{DD}$, e.g. when the memory cell array 102 is in a first mode (e.g. in an active mode, which may also be referred to as a power mode). In the active mode, the core-cells (i.e. the memory cells of the memory cell array) and the periphery circuit(s) of the memory may be supplied at $V_{DD}$. The at least one supply voltage $V_{SUPP}$ may be at least substantially equal to a regulated voltage $V_{REG}$ that may be different from the nominal supply voltage $V_{DD}$, e.g. when the memory cell array 102 is in a second mode (e.g. in an idle mode or standby mode). In an example, the regulated voltage $V_{REG}$ (e.g. when the memory cell array 102 is in an idle mode) may be less than that the nominal supply voltage $V_{DD}$ (e.g. when the memory cell array 102 is in an active mode).

As described above, power consumption due to leakage currents in the memory cell array 102 may be a major contributor to the total power consumption in the circuit arrangement 101, which may in turn be a major contributor to the total power consumption in the device 100.

Various design techniques have been investigated (e.g. for logic and/or memory circuits) to address the growing issues related to static power consumption. For example, techniques to reduce the at least one supply voltage $V_{SUPP}$ when the memory cell array 102 (e.g. SRAM cell array) is in a mode other than an active mode (e.g. in a standby and/or idle mode) have drawn attention because substantial leakage reduction may be achieved.

At the architectural level, so-called test memory cells (which may also be referred to as mock cells) may be used to monitor the at least one supply voltage $V_{SUPP}$. A test memory cell may be a memory cell other than the plurality of memory cells 102-MC that may be configured to flip its contents when the at least one supply voltage $V_{SUPP}$ is below a specific voltage level. Therefore, a scaling of the at least one supply voltage $V_{SUPP}$ may be determined based on a readout of such test memory cells in case the at least one supply voltage $V_{SUPP}$ falls below the specific voltage level.

Another approach may be to use a power gating mechanism (e.g. a power switching mechanism) and/or a voltage regulation system to allow power modes on the memory (e.g. SRAM). For example, before a long period of inactivity, the memory (e.g. SRAM) may be switched to an intermediate low-power mode, called deep-sleep. In this mode, a voltage supplied to peripheral circuitry of the memory (e.g. SRAM) may be gated-off (in other words, switched off), while a voltage regulator may be used to reduce the supply voltage $V_{SUPP}$ to a level that may allow data retention in the memory cell array 102. In the description that follows an overview of such a power gating mechanism (e.g. a power switching mechanism) and/or a voltage regulation system is presented.

Figure 2:
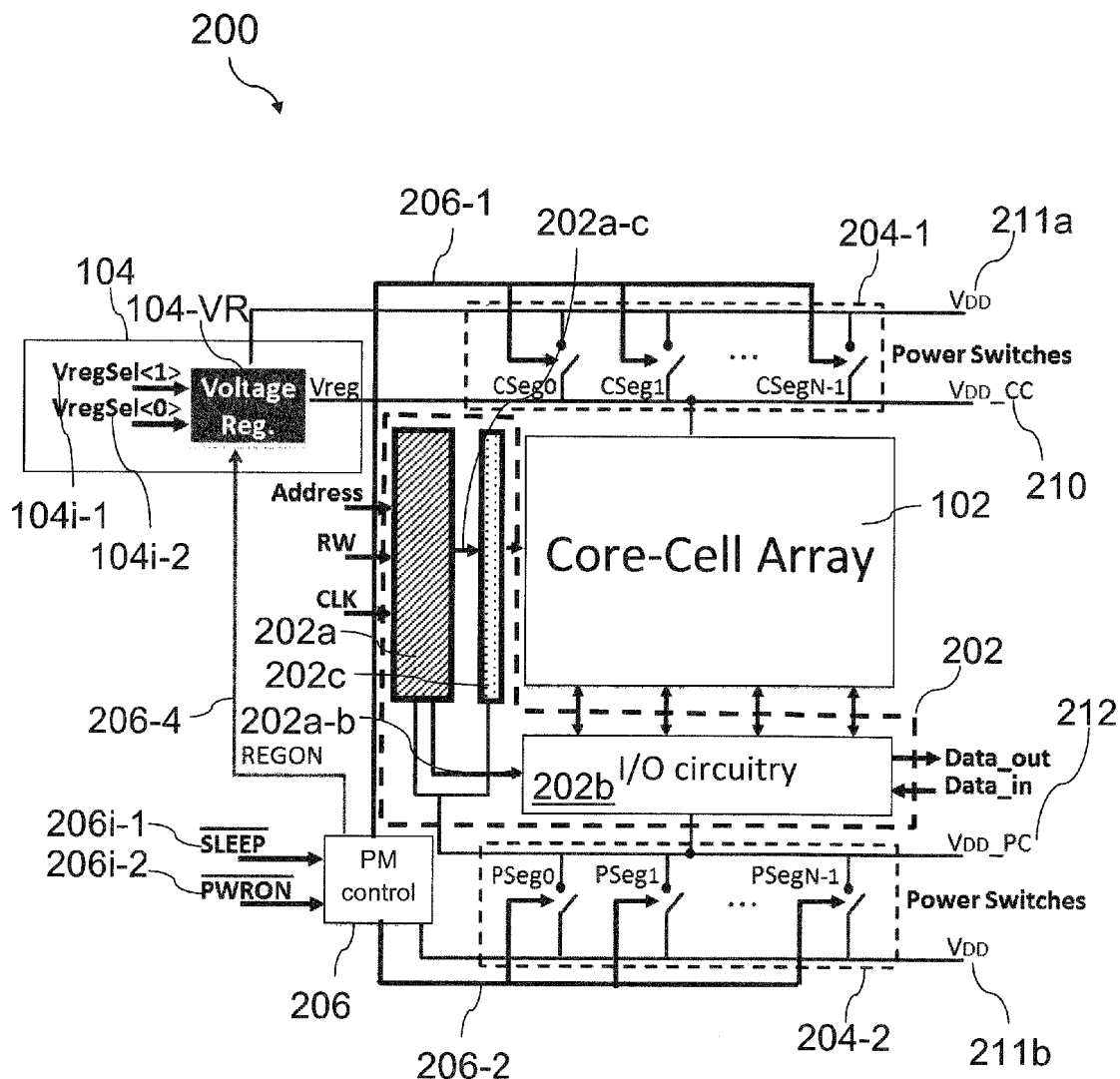
FIG. 2 shows a detailed block diagram of a circuit arrangement including the memory cell array and the voltage source shown in FIG. 1.

FIG. 2 shows a detailed block diagram of a circuit arrangement 200 including the memory cell array 102 and the voltage source 104 shown in FIG. 1.

Reference signs in FIG. 2 that are the same as in FIG. 1B denote the same or similar elements as in FIG. 1B. Thus, those elements will not be described in detail again here; reference is made to the description above. Differences between FIG. 2 and FIG. 1B are described below.

The circuit arrangement 200 shown in FIG. 2 may, for example, be identified with the at least one circuit and/or circuit arrangement 101 shown in FIG. 1B.

As shown in FIG. 2, the circuit arrangement 200 may include the memory cell array 102 (e.g. SRAM cell array, indicated as "Core-cell Array" in FIG. 2) and the voltage source 104. The circuit arrangement 200 may further include a memory peripheral circuit 202, which may be configured to provide access to the memory cell array 102 (e.g. SRAM cell array).

The memory peripheral circuit 202 may include a control circuit 202a and an input/output (I/O) circuit 202b (also indicated as "I/O circuitry" in FIG. 2).

The control circuit 202a of the memory peripheral circuit 202 may be configured to control an access to the memory cell array 102 (e.g. SRAM cell array). For example, the control circuit 202a may provide a control signal 202a-c to an address decoder 202c, which may be included in the memory peripheral circuit 202. The address decoder 202c may be configured to decode an address of a memory cell of the plurality of memory cells 102-MC of the memory cell array 102. In such an example, the control circuit 202a may control access to the memory cell array 102 (e.g. SRAM cell array) via the address decoder 202c.

By way of another example, the control circuit 202a may control access to the memory cell array 102 (e.g. SRAM cell array) via the I/O circuit 202b. For example, the control circuit 202a may provide a control signal 202a-b to the I/O circuit 202b, which may be configured to write data to the memory cell array 102 (e.g. SRAM cell array) and/or retreive data from the memory cell array 102 (e.g. SRAM cell array). For example, the I/O circuit 202b of the memory peripheral circuit 202 may be configured to provide an input signal (indicated as "Data_in" in FIG. 2) to the memory cell array 102 (e.g. SRAM cell array) in case the control signal 202a-b provided by the control circuit 202a to the I/O circuit 202b indicates that a write operation needs to be performed. By way of another example, the I/O circuit 202b of the memory peripheral circuit 202 may be configured to receive an output signal (indicated as "Data_out" in FIG. 2) from the memory cell array 102 (e.g. SRAM cell array) in case the control signal 202a-b provided by the control circuit 202a to the I/O circuit 202b indicates that a read operation needs to be performed.

The voltage source 104 may be configured to provide a supply voltage to the the memory cell array 102. In an alternative which is not shown in the figures, the voltage source may be configured to provide a supply voltage to the memory peripheral circuit.

The provision of the supply voltage to the memory cell array 102 (e.g. SRAM cell array) and the memory peripheral circuit 202 (e.g. I/O circuitry, control block and address decoder) may, for example, be controlled by means of a power gating facility (e.g. controlled by a switching mechanism).

In this regard, the circuit arrangement 200 may include a first switching structure 204-1 and a second switching structure 204-2. The power gating facility may be implemented by means of the first switching structure 204-1 (e.g. power switch (PS) block) and the second switching structure 204-2 (e.g. power switch (PS) block). In other words, provision of a supply voltage to the memory cell array 102 (e.g. SRAM cell array) and the memory peripheral circuit 202 (e.g. I/O circuitry, control block and address decoder) may be controlled by the first switching structure 204-1 (e.g. PS block) and the second switching structure 204-2 (e.g. PS block), respectively.

The first switching structure 204-1 (e.g. PS block) may be coupled between the main supply rail (indicated as supply line 211a, also indicated as $V_{DD}$ in FIG. 2) and the memory cell array 102 (e.g. SRAM cell array) internal supply line (indicated as internal supply line 210, also indicated as $V_{DD\_CC}$ in FIG. 2). Accordingly, the first switching structure 204-1 (e.g. PS block) may control provision of the supply voltage to the memory cell array 102 (e.g. SRAM cell array). For example, electrical power may be supplied to the memory cell array 102 (e.g. SRAM cell array) in case the main supply rail (indicated as supply line 211a and $V_{DD}$) is connected (e.g. electrically connected) to the internal supply line 210 (also indicated as $V_{DD}\_CC$) by means of the first switching structure 204-1 (e.g. via closed switches of the first switching structure 204-1). By way of another example, electrical power may not be supplied to the memory cell array 102 (e.g. SRAM cell array) in case the main supply rail (indicated as supply line 211a and $V_{DD}$) is disconnected (e.g. electrically connected) from the internal supply line 210 (also indicated as $V_{DD}\_CC$), e.g. due to open switches of the first switching structure 204-1.

The second switching structure 204-2 (e.g. PS block) may be coupled between the main supply rail (indicated as supply line 211b, also indicated as $V_{DD}$ in FIG. 2) and the memory peripheral circuit 202 (e.g. I/O circuitry, control block and address decoder) internal supply line (indicated as internal supply line 212, also indicated as $V_{DD}\_PC$ in FIG. 2). Accordingly, the second switching structure 204-2 (e.g. PS block) may control provision of the supply voltage to the memory peripheral circuit 202 (e.g. I/O circuitry, control block and address decoder). For example, electrical power may be supplied to the memory peripheral circuit 202 in case the main supply rail (indicated as supply line 211b and $V_{DD}$) is connected (e.g. electrically connected) to the internal supply line 212 (also indicated as $V_{DD}\_PC$) by means of the second switching structure 204-2 (e.g. via closed switches of the second switching structure 204-2). By way of another example, electrical power may not be supplied to the memory peripheral circuit 202 in case the main supply rail (indicated as supply line 211b and $V_{DD}$) is disconnected (e.g. electrically connected) from the internal supply line 212 (also indicated as $V_{DD}\_PC$), e.g. due to open switches of the second switching structure 204-2.

The first and/or second switching structures 204-1, 204-2 may include a plurality of switches (e.g. transistors, e.g. metal-oxide-semiconductor (MOS) transistors, e.g. PMOS transistors), that may be structured in N segments. For example, in the circuit arrangement 200 shown in FIG. 2, the first switching structure 204-1 may be implemented through a network of switches (e.g. transistors) structured in N segments, which are indicated as $CSeg_i$ in FIG. 2, where $i \in [0, N-1]$. In like manner, the second switching structure 204-2 may be implemented through a network of switches (e.g. transistors) structured in N segments, which are indicated as $PSeg_i$ in FIG. 2, where $i \in [0, N-1]$.

The circuit arrangement 200 may include a switching control circuit 206, which may be configured to control a switching of the first switching structure 204-1 and the second switching structure 204-2. The switching control circuit 206 may include, or may be, a power mode (PM) control logic circuit, which may be configured to control the switching of the first switching structure 204-1 and the second switching structure 204-2.

For example, in the circuit arrangement 200 shown in FIG. 2, the switching control circuit 206 may provide a control signal 206-1 to the first switching structure 204-1, which may control the switching of each switch of the plurality of switches $CSeg_i$, $i \in [0, N-1]$ of the first switching structure 204-1. In like manner, the switching control circuit 206 may provide a control signal 206-2 to the second switching structure 204-2, which may control the switching of each switch of the plurality of switches $PSeg_i$, $i \in [0, N-1]$ of the second switching structure 204-2.

The voltage source 104 may include a voltage regulator 104-VR. The voltage regulator 104-VR may, for example, enable the voltage source 104 to regulate a voltage supplied to the memory cell array 102 (e.g. SRAM cell array) and/or the memory peripheral circuit 202 (e.g. I/O circuitry, control block and address decoder).

The switching control circuit 206 may be configured to provide a control signal 206-4 (indicated as "REGON" in FIG. 2) to the voltage regulator 104-VR of the voltage source 104. The control signal 206-4 may, for example, provide an indication to the voltage regulator 104-VR of whether a regulated voltage (e.g. a voltage other than a nominal supply voltage $V_{DD}$, e.g. less than the nominal supply voltage $V_{DD}$) may need for the memory cell array 102 (e.g. SRAM cell array).

For example, the control signal 206-4 provided by the switching control circuit 206 to the voltage regulator 104-VR of the voltage source 104 may be inactivated (e.g. set to logic '0'), which may indicate that a regulated voltage (e.g. a voltage other than a nominal supply voltage $V_{DD}$, e.g. less than the nominal supply voltage $V_{DD}$) need not be provided by the voltage regulator 104-VR to the memory cell array 102 (e.g. SRAM cell array). In such an example, the control signal 206-4 provided by the switching control circuit 206 to the voltage regulator 104-VR of the voltage source 104 may subsequently be activated (e.g. set to logic '1'), which may indicate that a regulated voltage (e.g. a voltage other than a nominal supply voltage $V_{DD}$, e.g. less than the nominal supply voltage $V_{DD}$) may need be provided by the voltage regulator 104-VR to the memory cell array 102 (e.g. SRAM cell array).

The power gating mechanism (e.g. provided by the first switching structure 204-1 and the second switching structure 204-2) and a voltage regulation system (e.g provided by the voltage regulator 104-VR) may enable a plurality of modes (also referred to as power modes) of the memory (e.g. SRAM).

For example, the plurality of modes (e.g. power modes) may be produced by varying the supply voltage provided to the memory cell array 102 (indicated as internal supply line 210, also indicated as $V_{DD}\_CC$ in FIG. 2) and/or by varying the supply voltage provided to the memory peripheral circuit 202 (indicated as internal supply line 212, also indicated as $V_{DD}\_PC$ in FIG. 2). In other words, the voltage source 104 may be configured to provide a first supply voltage (which may be identified with internal supply line $V_{DD}\_CC$) and a second supply voltage (which may be identified with internal supply line $V_{DD}\_PC$), if desired. It is to be noted that this alternative is not shown in the figures.

The plurality of modes of the memory (e.g. SRAM) may include at least one of: (1) an active mode, (2) a deep-sleep mode, and (3) a power-off mode.

In the active (ACT) mode, the first switching structure 204-1 (e.g. PS block) and the second switching structure 204-2 (e.g. PS block) may be activated. In other words, the first switching structure 204-1 (e.g. PS block) and the second switching structure 204-2 (e.g. PS block) may be configured to couple the nominal supply voltage $V_{DD}$ shown in FIG. 2 to the memory cell array 102 (e.g. SRAM cell array) and the memory peripheral circuit 202 (e.g. I/O circuitry, control block and address decoder), respectively.

This configuration may allow internal supply line $V_{DD}\_CC$ and internal supply line $V_{DD}\_PC$ to be driven by a main supply rail $V_{DD}$, as shown in FIG. 2. Hence, the memory cell array 102 (e.g. SRAM cell array) and the memory peripheral circuit 202 (e.g. I/O circuitry, control block and address decoder) may be powered by the nominal supply voltage $V_{DD}$, and the memory cell array 102 (e.g. SRAM cell array) may be enabled to perform read and write operations. In the ACT mode, the control signal 206-4 provided by the switching control circuit 206 to the voltage regulator 104-VR of the voltage source 104 may indicate that a regulated voltage (e.g. a voltage other than a nominal supply voltage $V_{DD}$, e.g. less than the nominal supply voltage $V_{DD}$) need not be provided by the voltage regulator 104-VR to the memory cell array 102 (e.g. SRAM cell array).

In deep-sleep (DS) and power-off (PO) modes the first switching structure 204-1 and the second switching structure 204-2 (e.g. PS block) may be deactivated. In other words, the first switching structure 204-1 (e.g. PS block) and the second switching structure 204-2 (e.g. PS block) may be configured to decouple the nominal supply voltage $V_{DD}$ shown in FIG. 2 from the memory cell array 102 (e.g. SRAM cell array) and the memory peripheral circuit 202 (e.g. I/O circuitry, control block and address decoder), respectively. Accordingly, internal supply line $V_{DD}\_CC$ and internal supply line $V_{DD}\_PC$ may no longer be connected to the nominal supply voltage $V_{DD}$.

In DS mode, the voltage regulator 104-VR of the voltage source 104 may be configured to generate a regulated voltage Vreg shown in FIG. 2. The regulated voltage Vreg may be lower than the nominal supply voltage $V_{DD}$ supplied by the main supply rail $V_{DD}$. The regulated voltage Vreg may be provided to the memory cell array 102 (e.g. SRAM cell array)

through the internal supply line $V_{DD}\_CC$, whereas the internal supply line $V_{DD}\_PC$ may discharge to 0 V. In other words, in the DS mode, the voltage regulator 104-VR of the voltage source 104 may be enabled for the memory cell array 102 (e.g. SRAM cell array), and may be disabled for the memory peripheral circuit 202 (e.g. I/O circuitry, control block and address decoder), if desired (this is not shown in the figures). The regulated voltage Vreg, which may be sufficient to guarantee data retention in the memory cell array 102 (e.g. SRAM cell array), may reduce static power consumption due to current leakage. Since the memory peripheral circuit 202 may be switched off in the DS mode (e.g. due at least in part to $V_{DD}\_PC$ discharging to 0 V), no operation (e.g. read and/or write operation) may be performed on the memory cell array 102 (e.g. SRAM cell array).

In PO mode, the voltage regulator 104-VR of the voltage source 104 may be disabled for the memory cell array 102 and the memory peripheral circuit 202 (e.g. I/O circuitry, control block and address decoder). Hence, the internal supply lines $V_{DD}\_CC$ and $V_{DD}\_PC$ may discharge to 0 V. The memory cell array 102 may no longer be able to retain any data stored in it in the PO mode.

As described above, the switching control circuit 206 (e.g. PM control logic circuit) may control a switching of the first switching structure 204-1 (e.g. by means of the control signal 206-1) and the second switching structure 204-2 (e.g. by means of the control signal 206-2). Furthermore, the switching control circuit 206 may provide the control signal 206-4 to the voltage regulator 104-VR of the voltage source 104. The control signals 206-1, 206-2 and 206-4 may be generated based on at least one input signal 206i-1, 206i-2 provided to the switching control circuit 206. The at least one input signal 206i-1, 206i-2 are also indicated as $\overline{SLEEP}$ and $\overline{PWRON}$ in FIG. 2. Accordingly, the at least one input signal 206i-1, 206i-2 may allow switching among the plurality of modes (e.g. power modes) of the memory (e.g. SRAM). As shown in FIG. 2, the switching control circuit 206 (e.g. PM control logic circuit) may be supplied by the main supply rail $V_{DD}$ so as to enable the switching control circuit 206 to control the switching of the memory (e.g. SRAM) among its plurality of modes (e.g. power modes).

The voltage regulator 104-VR of the voltage source 104 may be configured to generate a plurality of voltage levels that may, for example, be supplied as the regulated voltage Vreg. For example, the voltage regulator 104-VR may generate four voltage levels when it is activated (e.g. by means of the control signal 206-4 from the switching control circuit 206), although the number of voltage levels that may be generated may be two, three, or more than four, such as, five, six, seven, etc. The plurality of voltage levels may, for example, include at least one of: $0.78*V_{DD}$ (i.e. 78% of the nominal supply voltage $V_{DD}$), $0.74*V_{DD}$ (i.e. 74% of the nominal supply voltage $V_{DD}$), $0.70*V_{DD}$ (i.e. 70% of the nominal supply voltage $V_{DD}$), and $0.64*V_{DD}$ (i.e. 64% of the nominal supply voltage $V_{DD}$). In such an example, the regulated voltage Vreg supplied to the memory cell array 102 (e.g. in DS mode) may be at least substantially equal to at least one of the above-identified voltage levels.

The voltage regulator 104-VR of the voltage source 104 may be configured to receive at least one input signal 104i-1, 104i-2 (indicated as VregSel<1> and VregSel<0> in FIG. 2). The at least one input signal 104i-1, 104i-2 provided to the voltage regulator 104-VR may allow a selection of a voltage level of the plurality of voltage levels generated by the voltage regulator 104-VR. For example, the at least one input signal 104i-1, 104i-2 provided to the voltage regulator 104-VR may allow a selection of a voltage level from among the plurality of voltage levels $0.78*V_{DD}$ (i.e. 78% of the nominal supply voltage $V_{DD}$), $0.74*V_{DD}$ (i.e. 74% of the nominal supply voltage $V_{DD}$), $0.70*V_{DD}$ (i.e. 70% of the nominal supply voltage $V_{DD}$), and $0.64*V_{DD}$ (i.e. 64% of the nominal supply voltage $V_{DD}$) that may be generated by the voltage regulator 104-VR.

In an example where the control signal 206-4 provided by the switching control circuit 206 (e.g. PM control logic circuit) to the voltage regulator 104-VR may indicate that a regulated voltage (e.g. a voltage other than a nominal supply voltage $V_{DD}$) need not be provided by the voltage regulator 104-VR to the memory cell array 102 (e.g. SRAM cell array), no voltage level may be generated by the voltage regulator 104-VR regardless of the selection indicated by the least one input signal 104i-1, 104i-2 to the voltage regulator 104-VR.

In DS mode, a lowering of the regulated voltage Vreg provided to the memory cell array 102 may maximize static power savings. However, lowering the regulated voltage Vreg too far may cause data retention faults. For example, a data loss may occur in the memory cell array 102 in case the voltage regulator 104-VR supplies the plurality of memory cells 102-MC of the memory cell array 102 with a voltage level that may be lower than a data retention voltage, which may, for example, be a minimum voltage that may ensure data retention in the memory cell array 102 (e.g. SRAM cell array).

Furthermore, a lowering of the regulated voltage Vreg too far may cause an increase in an amount of time required to switch the memory (e.g. SRAM) back into ACT mode. This amount of time may be referred to as wake-up time (WUT), and may exceed the maximum allowed value specified during the design phase in case the regulated voltage Vreg is lowered too far.

On the other hand, increasing the regulated voltage Vreg supplied to the memory cell array 102 (e.g. SRAM cell array) in DS mode may minimize the probability of occurrence of data retention faults, and may minimize the WUT. However, increasing the regulated voltage Vreg too much may lead to a static power consumption that may exceed the specified maximum budget for the memory (e.g. SRAM) in DS mode.

Based on these observations, it may be noted that the regulated voltage Vreg may be within a specified range [Vreg_LB, Vreg_UB], where Vreg_LB and Vreg_UB correspond to the allowed lower and upper bounds of the regulated voltage Vreg, respectively. In case the regulated voltage Vreg falls within this range, the following requirements may satisfied: (i) data retention may be ensured in the plurality of memory cells 102-MC of the memory cell array 102; (ii) the maximum value of WUT may not be exceeded; (iii) the maximum budget for memory cell array 102 (e.g. SRAM cell array) static power consumption in DS mode may not be exceeded.

Testing the regulated voltage Vreg supplied by the voltage regulator 104-VR may be accomplished by means of measuring the voltage level supplied to the memory cell array 102 in DS mode, and then by verifying whether or not it is within the specified range [Vreg_LB, Vreg_UB].

A straightforward approach would be to insert an observation point (e.g. a test point) to monitor the voltage at the internal supply line $V_{DD}\_CC$ when the memory (e.g. SRAM) is in DS mode. However, such an observation method may be inaccurate since test results may be susceptible to measurement induced errors.

Another approach would be to embed an analog-to-digital converter to generate a digital signature based on the voltage level at the internal supply line $V_{DD}\_CC$. This approach, however, can be costly in terms of area overhead, and may depend on the targeted precision, and may also be sensitive to process variations.

In light of the above-described observations, the following needs may be identified:

There may be a need to provide a low area overhead test circuit that can be embedded on-chip to determine whether a regulated voltage Vreg falls within an allowed range of values [Vreg_LB, Vreg_UB].

There may be a need to provide a low area overhead test circuit that can be embedded on-chip to change a level of a regulated voltage Vreg in case it is determined that the regulated voltage Vreg does not fall within an allowed range of values [Vreg_LB, Vreg_UB].

There may be a need to provide a low area overhead test circuit that can be embedded on-chip to test a voltage regulator, e.g. in order to ensure proper functioning of the voltage regulator.

There may be a need to provide a low area overhead test circuit that can be embedded on-chip to detect a problem in a voltage regulator, e.g. in order to ensure proper functioning of the voltage regulator.

There may be a need to provide a low area overhead test circuit that can be embedded on-chip to repair a voltage regulator in case it is determined that the voltage regulator is not functioning properly and/or in case a problem is detected in the voltage regulator.

There may be a need for a low area overhead BIST (built-in self-test) circuit and/or a low area overhead BISR (built-in self-repair) circuit that may be integrated with (e.g. embedded in) a memory (e.g. SRAM, e.g. low-power SRAM) to automatically test, diagnose and repair (e.g. based on a reconfiguration strategy) a voltage regulator that may provide a regulated voltage to the memory cell array.

Figure 3:
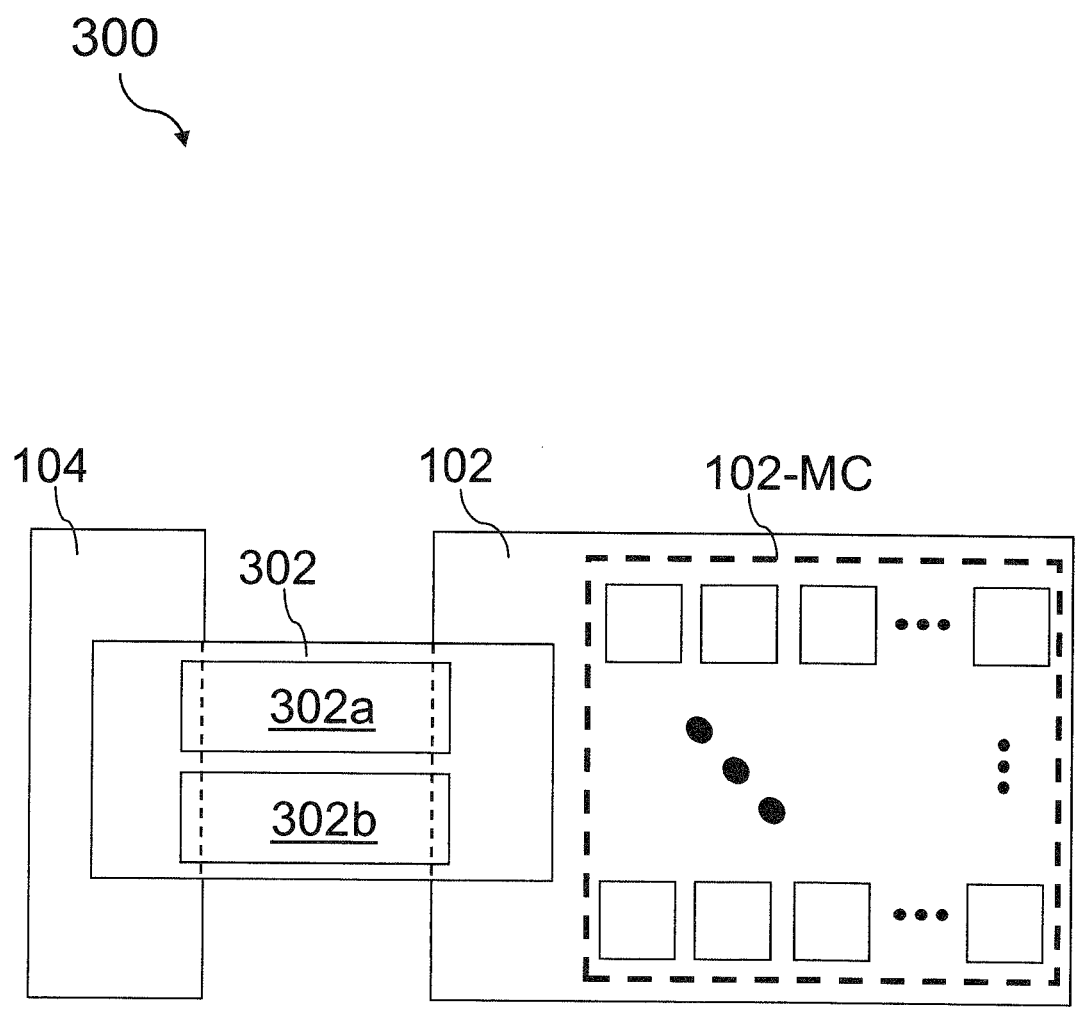
FIG. 3 shows a block diagram of a circuit arrangement including a memory cell array, a voltage source, and a test circuit.

At least one of the aforementioned needs may, for example, be met by the circuit arrangement shown in FIG. 3.

FIG. 3 shows a block diagram of a circuit arrangement 300 including a memory cell array 102, a voltage source 104, and a test circuit 302.

Reference signs in FIG. 3 that are the same as in FIG. 1B and FIG. 2 denote the same or similar elements as in FIG. 1B and FIG. 2. Thus, those elements will not be described in detail again here; reference is made to the description above. Differences between FIG. 3 and FIGS. 1B and 2 are described below.

The voltage source 104 may be configured to provide at least one supply voltage to the test circuit 302. The at least one supply voltage provided by the voltage source 104 to the memory cell array 102 (e.g. SRAM cell array) may be identical to or may be different from the at least one supply voltage provided by the voltage source to the test circuit 302.

The test circuit 302 may be configured to receive the supply voltage (e.g. from the voltage source 104). The test circuit 302 may be integrated (e.g. monolithically integrated) with the memory cell array 102 and the voltage source 104, as shown in FIG. 3.

The test circuit 302 may include at least one test memory cell 302a, and at least one failure detection circuit 302b, which may be configured to detect a data retention failure in the at least one test memory cell 302a. In other words, the at least one failure detection circuit 302b may be configured to detect if the at least one test memory cell 302a retains data that may be stored in it.

As described above in relation to FIG. 1B and FIG. 2, a data loss may occur in a memory cell of the plurality of memory cells 102-MC in case a regulated voltage Vreg is lower than a data retention voltage of the memory cell of the plurality of memory cells 102-MC. Accordingly, in the circuit arrangement 300 shown in FIG. 3, the at least one test memory cell 302a (which may receive a regulated voltage Vreg from the voltage source 104), may lose data stored in it in case the regulated voltage Vreg provided to it is lower than a data retention voltage. This loss of data in the at least one test memory cell 302a may, for example, be detected by the failure detection circuit 302b.

As shown in FIG. 3, the test circuit 302 may be integrated (e.g. monolithically integrated) with the memory cell array 102 and the voltage source 104. Accordingly, the circuit arrangement 300 shown in FIG. 3 may provide a low area overhead circuit arrangement that may, for example, enable a detection of a data retention failure in the at least one test memory cell 302a.

In the description that follows, the architecture of the at least one test memory cell 302a and the at least one failure detection circuit 302b is provided. Furthermore, a detailed description of the functioning of the test circuit 302 is provided.

As described above, the memory cell array 102 may include a plurality of memory cells 102-MC. Each memory cell of the plurality of memory cells 102-MC may include a plurality of cross-coupled inverters (which may also be referred to as internal cross-coupled inverters). When the at least one supply voltage of a memory cell of the plurality of memory cells 102-MC scales down, the voltage transfer curves (VTCs) of the internal cross-coupled inverters may degrade, which may in turn reduce the static noise margin (SNM) of the memory cell of the plurality of memory cells 102-MC.

Furthermore, the at least one supply voltage of the memory cell may be scaled down up to the level in which the SNM of the memory cell of the plurality of memory cells 102-MC at least substantially equals to about zero, while still ensuring data retention. A data retention voltage (DRV) of the memory cell of the plurality of memory cells 102-MC can thus be defined as the voltage at which the SNM of the memory cell at least substantially equals to about zero. If the at least one supply voltage is scaled down to a level lower than DRV, the cross-coupled inverters may flip to a state determined by the deteriorated VTCs, and the memory cell may lose the capability to retain data.

A similar relation among the SNM, DRV and VTCs of the at least one test memory cell 302a of the test circuit 302 may apply. However, the at least one test memory cell 302a may include, or may be, a special memory cell that may be configured such that the DRV for holding logic '1' (which may be referred to as $DRV_1$) may be accurately tuned. In other words, the $DRV_1$ of the at least one test memory cell 302a may be tuned, thus, a data retention stability of the at least one test memory cell 302a may be tuned.

Figures 4A, 4B, 4C:
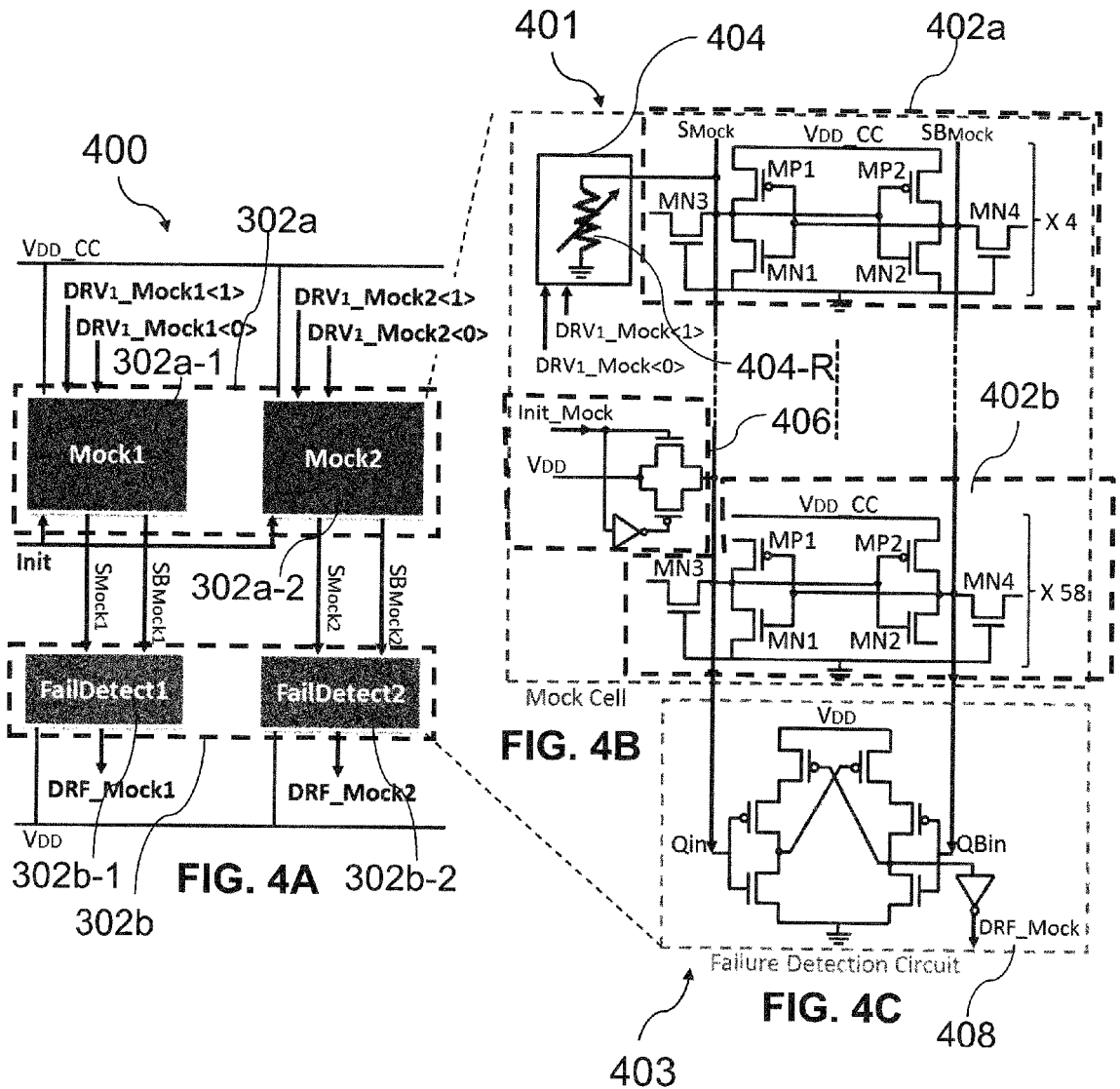
FIG. 4A shows a block diagram of at least one test memory cell and at least one failure detection circuit of a test circuit.
FIG. 4B shows an internal structure of at the least one test memory cell shown in FIG. 4A.
FIG. 4C shows an internal structure of at the least one failure detection circuit shown in FIG. 4A.

FIG. 4A shows a block diagram 400 of the at least one test memory cell 302a and the at least one failure detection circuit 302b.

Reference signs in FIG. 4A that are the same as in FIG. 3 denote the same or similar elements as in FIG. 3. Thus, those elements will not be described in detail again here; reference is made to the description above. Differences between FIG. 4 and FIG. 3 are described below.

As shown in FIG. 4, the at least one test memory cell 302a may include a first test memory cell 302a-1 (also indicated as "Mock 1") and a second test memory cell 302a-2 (also indicated as "Mock 2"). A test memory cell may be a special memory cell (e.g. SRAM core-cell) that may be configured to lose stored data when supplied at a voltage level that is lower than a predefined threshold.

The at least one failure detection circuit 302*b* may include a first failure detection circuit 302*b*-1 configured to detect a data retention failure in the first test memory cell 302*a*-1, and a second failure detection circuit 302*b*-2 configured to detect a data retention failure in the second test memory cell 302*a*-2. The at least one failure detection circuit 302*b* may monitor the storage nodes (indicated as $S_{Mock}$ and $SB_{Mock}$) of the at least one test memory cell 302*a*, and may detect whether or not the at least one test memory cell 302*a* fails to retain stored data.

FIG. 4B shows an internal structure 401 of at least one test memory cell 302*a* shown in FIG. 4A.

The detailed block diagram 401 of the at least one test memory cell 302*a* may be identified with the first test memory cell 302*a*-1 and/or the second test memory cell 302*a*-2.

The at least one test memory cell 302*a* may include a plurality of first core-cells 402*a* and a plurality of second core-cells 402*b*. For example, in the block diagram 401 shown in FIG. 4B, the at least one test memory cell 302*a* may include four classical 6T core-cells (which may be identified with the plurality of first core-cells 402*a*) and fifty-eight partial SRAM core-cells (which may be identified with the plurality of second core-cells 402*b*).

Each core-cell of the plurality of second core-cells 402*b* (e.g. partial SRAM core-cells) may include a plurality of switches (e.g. a plurality of transistors MP1 and MN1) with floating source nodes to degrade the SNM for holding logic '1' ($SNM_1$) of the at least one test memory cell 302*a*. Therefore, the at least one test memory cell 302*a* having the internal structure 401 may have a lower data retention stability (e.g. for holding logic '1') than the plurality of memory cells 102-MC of the memory cell array 102 (e.g. SRAM cell array).

As a consequence, the $DRV_1$ of the at least one test memory cell 302*a* having the internal structure 401 may be higher than the $DRV_1$ of plurality of memory cells 102-MC of the memory cell array 102 (e.g. SRAM cell array). As shown in FIG. 4B, the plurality of first core-cells 402*a* and the plurality of second core-cells 402*b* of the at least one test memory cell 302*a* may be interconnected through their storage nodes $S_{Mock}$ and $SB_{Mock}$. This may be done in order to average local mismatches and minimize impacts of process variations on $DRV_1$.

As shown in FIG. 4B, each core-cell of the plurality of first and second core-cells 402*a*, 402*b* may include pass switches (e.g. pass transistors MN3 and MN4). The pass switches (e.g. pass transistors MN3 and MN4) may be turned off (e.g. permanently turned off), for example, since data retention is of interest.

Based on the internal structure 401 of the at least one test memory cell 302*a* shown in FIG. 4B, a tuning mechanism may be developed that may, for example, allow a selection of different values of $DRV_1$.

In this regard, the test circuit 302 may further include a data retention stability tuning circuit 404, which may be configured to tune the data retention stability of the at least one test memory cell 302*a* having the internal structure 401 shown in FIG. 4B.

As shown in FIG. 4B, the data retention stability tuning circuit 404 may include a variable resistor 404-R.

The variable resistor 404-R of the data retention stability tuning circuit 404 may be inserted at the storage node $S_{Mock}$, as illustrated in FIG. 4B. The variable resistor 404-R may slightly pull down (e.g. lower) the voltage at $S_{Mock}$, which may degrade even more $SNM_1$ of the at least one test memory cell 302*a* having the internal structure 401 shown in FIG. 4B. With a degradation in $SNM_1$, the $DRV_1$, as a consequence, may depend on a resistance value of the variable resistor 404-R. The input signals $DRV_1\_Mock<0>$ and $DRV_1\_Mock<1>$ of the at least one test memory cell 302*a* having the internal structure 401 shown in FIG. 4B (e.g. to the data retention stability tuning circuit 404) may allow switching among a plurality of resistance values of the variable resistor 404-R, which may in turn switch among a plurality of values of $DRV_1$. For example, the input signals $DRV_1\_Mock<0>$ and $DRV_1\_Mock<1>$ may allow switching among four different resistance values, which also enable switching among four values of $DRV_1$ (e.g. at least substantially equal to about 0.55V, about 0.65V, about 0.75V and about 0.85V).

The at least one test memory cell 302*a* may include an initialization circuit 406 that may, for example, include gate (e.g. a transmission gate, e.g. a CMOS transmission gate) that may be controlled by an input signal Init_Mock, as shown in FIG. 4B. For example, if Init_Mock is activated (e.g. set to logic '1'), logic '1' may be written in the at least one test memory cell 302*a* by, for example, connecting the main supply rail $V_{DD}$ directly to storage node $S_{Mock}$.

FIG. 4C shows an internal structure 403 of at least one failure detection circuit 302*b* shown in FIG. 4A.

The detailed block diagram 403 of the at least one failure detection circuit 302*b* may be identified with the first failure detection circuit 302*b*-1 and/or the second failure detection circuit 302*b*-2.

The at least one failure detection circuit 302*b* may include, or may be, an amplifier circuit 408, as shown in FIG. 4C. Input signals Qin and QBin shown in FIG. 4C may be connected (e.g. directly connected) to storage nodes $S_{Mock}$ and $SB_{Mock}$ of the at least one test memory cell 302*a* that may be monitored by the at least one failure detection circuit 302*b*, as shown by the interconnection between FIG. 4B and FIG. 4C. Output signal DRF_Mock may remain inactivated (e.g. set to logic '0') as long as the at least one test memory cell 302*a* being monitored retains stored logic '1'. If the at least one test memory cell 302*a* loses the stored logic '1', which may be referred to as a data retention fault (DRF), the output signal DRF_Mock may be activated (e.g. set to logic '1') to indicate the occurrence of such fault.

As described above in relation to FIG. 2 and FIG. 3, the test circuit 302 may be configured to verify if the regulated voltage Vreg that supplies the memory cell array 102 (e.g. SRAM cell array) in DS mode is within a specified range [Vreg_LB, Vreg_UB] of allowed levels. This may be achieved by tuning $DRV_1$ of the first test memory cell 302*a*-1 and the second test memory cell 302*a*-2 to Vreg_LB and Vreg_UB, respectively, and by monitoring the first test memory cell 302*a*-1 and the second test memory cell 302*a*-2 to detect DRFs that may Occur.

As shown in FIG. 4A, the first test memory cell 302*a*-1 and the second test memory cell 302*a*-2 may be supplied by the internal supply line $V_{DD}\_CC$ of the memory cell array 102. Therefore, when the memory cell array 102 (e.g. SRAM cell array) is in DS mode, the memory cells of the memory cell array 102, the first test memory cell 302*a*-1, and the second test memory cell 302*a*-2 of the test circuit 302 may be supplied at regulated voltage Vreg.

As shown in FIG. 4A, the first failure detection circuit 302*b*-1 may monitor storage nodes $S_{Mock}$ and $SB_{Mock}$ of the first test memory cell 302*a*-1 (indicated as $S_{Mock1}$ and $SB_{Mock1}$ in FIG. 4A), while the second failure detection circuit 302*b*-2 may monitor storage nodes $S_{Mock}$ and $SB_{Mock}$ of the second test memory cell 302*a*-2 (indicated as $S_{Mock2}$ and $SB_{Mock2}$ in FIG. 4A).

The signals DRF_Mock1 and DRF_Mock2 may indicate the occurrence of a DRF in the first test memory cell 302*a*-1 and the second test memory cell 302*a*-2, respectively. It is noted that the first failure detection circuit 302*b*-1 and the second failure detection circuit 302*b*-2 may be supplied at the nominal voltage $V_{DD}$. The inputs DRV$_1$_Mock1<0> and DRV$_1$_Mock1<1> may allow the selection of DRV$_1$ of the first test memory cell 302*a*-1, whereas inputs DRV$_1$_Mock2<0> and DRV$_1$_Mock2<1> may allow the selection of DRV$_1$ of the second test memory cell 302*a*-2. The input Init may allow initializing the first test memory cell 302*a*-1 and the second test memory cell 302*a*-2 when it is activated (e.g. set to logic '1').

The description that follows provides an overview of how the occurrence of a DRF in the first test memory cell 302*a*-1 and/or the second test memory cell 302*a*-2 may be performed.

The first test memory cell 302*a*-1 and the second test memory cell 302*a*-2 may be initialized with data (e.g. logic '1'). This may require the memory (e.g. SRAM) to be in ACT mode such that the first test memory cell 302*a*-1 and the second test memory cell 302*a*-2 are supplied at the nominal voltage $V_{DD}$ during initialization.

Thereafter, the memory cell array 102 (e.g. SRAM cell array) may be switched from ACT to DS mode, and the initialization circuits of the first test memory cell 302*a*-1 and the second test memory cell 302*a*-2 may be turned off. At this time, the first failure detection circuit 302*b*-1 and the second failure detection circuit 302*b*-2 may monitor storage nodes of the first test memory cell 302*a*-1 and the second test memory cell 302*a*-2, respectively, for example, to detect the occurrence of DRFs. Output signals DRF_Mock1 and DRF_Mock2 may be deactivated (e.g. set to logic '0') as long as the first test memory cell 302*a*-1 and the second test memory cell 302*a*-2 store logic '1'.

In case a DRF occurs in the first test memory cell 302*a*-1, the first failure detection circuit 302*b*-1 may activate the output signal DRF_Mock1 (e.g. set to logic '1'). Similarly, the output signal DRF_Mock2 may be activated (e.g. set to logic '1') if a DRF in the second test memory cell 302*a*-2 is detected by the second failure detection circuit 302*b*-2.

Vreg may be within the range [Vreg_LB, Vreg_UB] if it is greater than or equal to Vreg_LB and less than or equal to Vreg_UB.

In various aspects of this disclosure, it will be assumed that DRV$_1$ of 302*a*-1 (Mock1) is tuned to Vreg_LB. The first condition (namely, Vreg greater than or equal to Vreg_LB) may be satisfied if a DRF does not occur in the first test memory cell 302*a*-1. In this case, DRF_Mock1 may remain deactivated (e.g. set to logic '0'). Furthermore, it will be assumed that DRV$_1$ of 302*a*-2 (Mock2) is tuned to Vreg_UB. The second condition (namely, Vreg less than or equal to Vreg_UB) may be satisfied if a DRF occurs in the second test memory cell 302*a*-2. In this case, DRF_Mock2 may be activated (e.g. set to logic '1').

Therefore, the test circuit 302 may indicate a PASS only if output signals DRF_Mock1 and DRF_Mock2 are deactivated (e.g. set to logic '0') and activated (e.g. set to logic '1'), respectively. If Vreg is higher than Vreg_UB, a DRF may not occur in the first test memory cell 302*a*-1 and the second test memory cell 302*a*-2 (e.g. DRF_Mock1 and DRF_Mock2 remain deactivated, e.g. set to logic '0').

Figure 5:
FIG. 5 shows a table that summarizes test results according to the logic values of outputs of a test circuit.

If Vreg is lower than Vreg_LB, a DRF may occur in the first test memory cell 302*a*-1 and the second test memory cell 302*a*-2 (e.g. DRF_Mock1 and DRF_Mock2 may be activated, e.g. set to logic '1'). It may be noted that DRF_Mock1 activated (e.g. set to logic '1') and DRF_Mock2 deactivated (e.g. set to logic '0') may not be a valid test result. This may be because DRV$_1$ of the second test memory cell 302*a*-2 must be greater than DRV$_1$ of the first test memory cell 302*a*-1. Therefore, if a DRF occurs in the first test memory cell 302*a*-1, a DRF must also occur in the second test memory cell 302*a*-2. If such an invalid test appears, it indicates either that a wrong configuration of DRV$_1$ of the first and second test memory cells 302*a*-1, 302*a*-2 (DRV$_1$ of the first test memory cell 302*a*-1 greater than DRV$_1$ of the second test memory cell 302*a*-2) or a fault affecting the test circuit. FIG. 5 shows a table 500 that summarizes the test results according to the logic values of the outputs of the test circuit 302.

As described above, the test circuit 302 may include a data retention stability tuning circuit 404 that may receive input signals DRV$_1$_Mock<0> and DRV$_1$_Mock<1> that may allow switching among a plurality of values of DRV$_1$. Accordingly, the data retention stability tuning circuit 404 may provide the data retention stability of the first test memory cell 302*a*-1 (e.g. determined by DRV$_1$ of the first test memory cell 302*a*-1) and the data retention stability of the second test memory cell 302*a*-2 (e.g. determined by DRV$_1$ of the second test memory cell 302*a*-2), which may be different from the data retention stability of the first test memory cell 302*a*-1.

As described above, a DRF in the first test memory cell 302*a*-1 may be determined based on a comparison with Vreg_LB. Accordingly, the data retention stability tuning circuit 404 and the first test memory cell 302*a*-1 may provide a data retention stability of the first test memory cell 302*a*-1 at a first pre-defined supply voltage (e.g. Vreg_LB). In like manner, a DRF in the second test memory cell 302*a*-2 may be determined based on a comparison with Vreg_UB. Accordingly, the data retention stability tuning circuit 404 and the second test memory cell 302*a*-2 may provide a data retention stability of the second test memory cell 302*a*-1 at a second pre-defined supply voltage (e.g. Vreg_UB), which may be different from the first pre-defined supply voltage (e.g. Vreg_LB).

In the description above, an overview was provided which may show how the voltage regulator 104-VR of the voltage source 104 may be tested, e.g. to verify if the regulated voltage Vreg, which supplies the memory cell array 102 in DS mode, is within a specified range [Vreg_LB, Vreg_UB]. In the description that follows, a BIST (Built-in Self Test) circuit may be proposed, based on the test circuit. Following this, a BISR (Built-in Self Repair) circuit may be proposed to repair the voltage regulator 104-VR based on a reconfiguration strategy.

Figure 6:
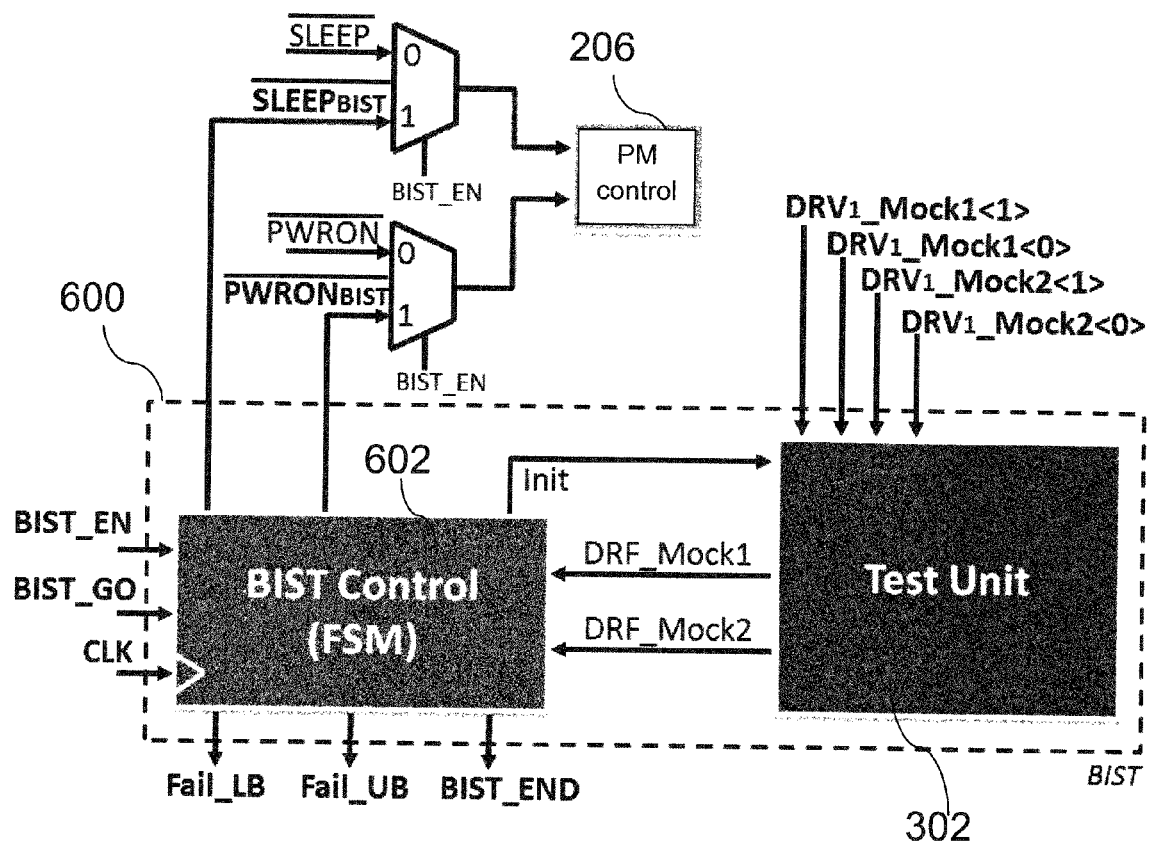
FIG. 6 shows an architecture of a BIST (Built-in Self Test) circuit and a switching control circuit.

FIG. 6 shows an architecture of a BIST circuit 600 and the switching control circuit 206.

Reference signs in FIG. 6 that are the same as in the previous figures denote the same or similar elements as in the previous figures. Thus, those elements will not be described in detail again here; reference is made to the description above. Differences between FIG. 6 and the previous figures are described below.

The BIST circuit 600 may include the test circuit 302 (e.g. as described above, e.g. in FIG. 4A to FIG. 4C) and a control circuit 602 (indicated as block BIST Control in FIG. 6).

The BIST circuit 600 may be enabled by activating an input signal BIST_EN (e.g. set to logic '1'), whereas a test may be triggered by activating an input signal BIST_GO (e.g. set to logic '1').

Output signal BIST_END that may be activated (e.g. set to logic '1') may indicate that a test is finished, whereas output signals Fail_LB and Fail_UB may be activated (e.g. set to logic '1') if lower bound Vreg_LB and upper bound Vreg_UB are violated, respectively.

Test circuit control signals that allow switching among a plurality of DRV$_1$ of the at least one test memory cell 302

(indicated as DRV$_1$_Mock1<0>, DRV$_1$_Mock1<1>, DRV$_1$_Mock2<0> and DRV$_1$_Mock2<1> in FIG. 6) may be inputs of the BIST circuit 600.

Such input signals may specify the range [Vreg_LB, Vreg_UB]. It is noted that input signals of the switching control circuit 206 (e.g PM control logic) may be set by the BIST circuit 600, e.g. through signals $\overline{SLEEP_{BIST}}$ and $\overline{PWRON_{BIST}}$, e.g. when BIST_EN is activated (e.g. set to logic '1'). This may allow the BIST circuit 600 to switch among the modes (e.g. power modes) of the memory cell array 102.

The control circuit 602 (e.g. block BIST Control) maybe configured to control a test of the voltage source 104 (e.g. a test of the voltage regulator 104-VR of the voltage source 104). The control circuit 602 may implement a finite state machine (FSM) to control the test of the voltage source 104. For example, the FSM may be used to synchronize the operation of the test circuit 302, allowing self-testing of the voltage source (e.g. the voltage regulator of the voltage source).

Figure 7:
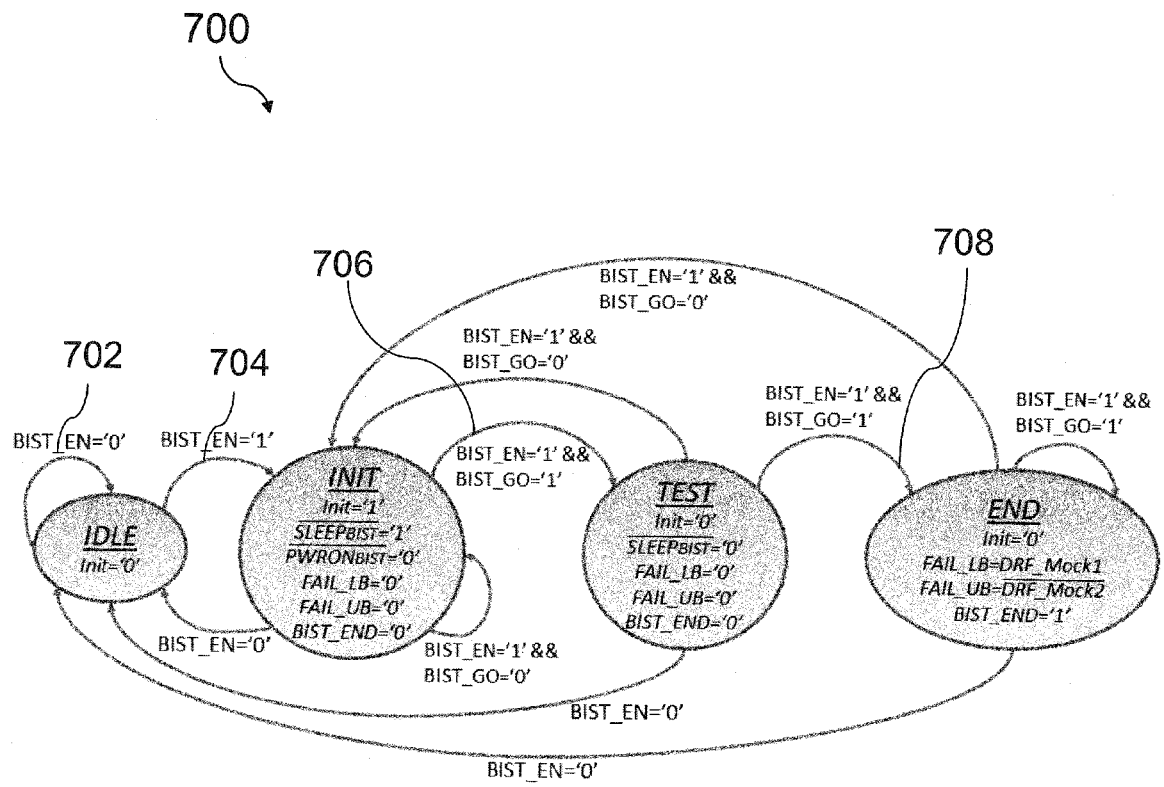
FIG. 7 shows a state transition diagram of a finite state machine (FSM) implemented by a control circuit.

FIG. 7 shows a state transition diagram 700 of a finite state machine (FSM) implemented by the control circuit 602.

The FSM may operate according to input signals BIST_EN, BIST_GO and the clock. For example, when signal BIST_EN is deactivated (e.g. set to logic '0') (e.g. indicated as arrow 702), the control circuit 602 may be in an IDLE state (BIST circuit 600 may be disabled). In this state, initialization circuits of the at least one test memory cell 302a may be switched off (Init may be set to logic '0'), such that no power may be consumed to keep nodes $S_{Mock}$ of the at least one test memory cell 302a charged to $V_{DD}$.

When BIST_EN is activated (e.g. set to logic '1') (e.g. indicated as arrow 704), the control circuit 602 may switch to INIT state. In such a state, the memory (e.g. SRAM) may be set to ACT mode (e.g. $\overline{SLEEP_{BIST}}$ and $\overline{PWRON_{BIST}}$ may be set to logic '1' and '0', respectively) and initialization circuits of the at least one test memory cell 302a may be turned on (Init is set to logic '1').

Once BIST_GO is activated (e.g. set to logic '1'), in INIT mode, the control circuit 602 may switch to TEST mode (e.g. indicated as arrow 706), where initialization circuits of the at least one test memory cell 302a may be turned off (e.g. Init is set to logic '0') and the memory cell array (e.g. SRAM cell array) is set to DS mode (e.g. $\overline{SLEEP_{BIST}}$ is set to logic '0').

As described above in relation to FIG. 4A to FIG. 4C, in test mode, the first test memory cell 302a-1 and the second test memory cell 302a-2 may be monitored by the first and second failure detection circuits 302b-1 and 302b-2, respectively, and the occurrences of DRFs may be indicated to the control circuit 602 through signals DRF_Mock1 and DRF_Mock2. A next clock pulse may switch the control circuit 602 to an END state (indicated as arrow 708).

This corresponds to the end of the test, where BIST_END may be activated (e.g. set to logic '1') and outputs Fail_LB and Fail_UB may indicate the occurrence of violations. As shown in FIG. 7, the control circuit 602 may switch to IDLE state when BIST_EN is deactivated (e.g. set to logic '0'), regardless of the current state. Furthermore, when BIST_EN is activated (e.g. set to logic '1') and BIST_GO is deactivated (e.g. set to logic '0'), the control circuit 602 may switch to INIT state.

As shown in FIG. 7, the testing of the voltage source 104 may be performed in three clock cycles. The period of time during which the memory (e.g. SRAM) is kept in DS mode during test phase (e.g. during $2^{nd}$ clock cycle, e.g. when the control circuit 602 is in TEST mode), may be a parameter of interest. When the supply voltage of the memory cell array 102 is close to DRV$_1$ of the at least one test memory cell 302a, storage nodes $S_{Mock1}$ and $S_{Mock2}$ may discharge slowly due to leakage currents. Therefore, an eventual DRF may be detected if the memory cell array 102 remains in DS mode for a period of time that is sufficient for the at least one test memory cell 302a to flip its contents. Thus, the period of time during which the memory cell array 102 (e.g. SRAM cell array) stays in DS mode may be a test parameter that may be maximized, without critical penalties in terms of test time. This may be achieved by using either an internal clock frequency divider or a dedicated test clock.

The BIST circuit 600 shown in FIG. 6 may not control input signals VregSel<0> and VregSel<1> of the voltage regulator 104-VR. Therefore, the BIST circuit 600 may test the voltage supply 104 (e.g. the voltage regulator 104-VR of the voltage supply 104) for a specific setup, which may be defined externally.

If a given configuration setting generates a Vreg that is not within the specified range, the BIST circuit 600 may indicate a fail, which may mean that such a setup cannot be used to generate Vreg in DS mode. Nevertheless, it may be possible that other configurations may generate a Vreg that is within specified range, thus such configurations can be used.

In the description that follows a BISR circuit is presented, which may be configured to search for a valid configuration of the voltage source 104 (e.g. the voltage regulator 104-VR of the voltage source 104) such that the generated Vreg may satisfy the constraints imposed by Vreg_LB and Vreg_UB.

Figure 8:
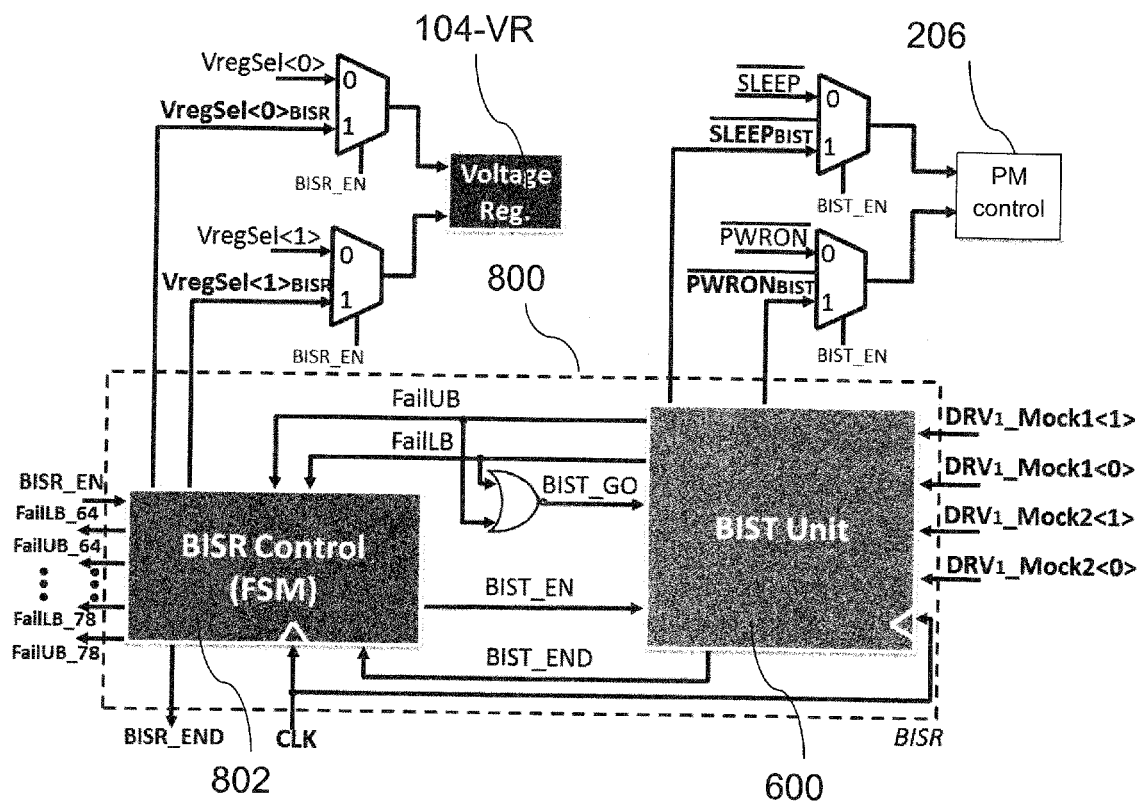
FIG. 8 shows an architecture of a BISR (Built-in Self Repair) circuit, a switching control circuit, and a voltage regulator.

FIG. 8 shows an architecture of a BISR circuit 800, the switching control circuit 206, and the voltage regulator 104-VR of the voltage source 104.

Reference signs in FIG. 8 that are the same as in the previous figures denote the same or similar elements as in the previous figures. Thus, those elements will not be described in detail again here; reference is made to the description above. Differences between FIG. 8 and the previous figures are described below.

As shown in FIG. 8, the BISR circuit 800 may include the BIST circuit 600 (e.g. described above in respect of FIG. 6), and a voltage source setting circuit 802 (which may be implemented by a control circuit; it is to be noted that the control circuit may also be configured to provide other functions such as e.g. may be configured to control the BIST circuit 600 and/or process output signals of the BIST circuit) (indicated as block BISR Control in FIG. 8).

The BISR circuit 800 may configure the voltage regulator 104-VR with a specific setup. Thereafter, the BIST circuit 800 may start the BIST (e.g. by means of the BIST circuit 600) to verify whether or not the generated Vreg is within the range [Vreg_LB, Vreg_UB]. If no violation is verified, the voltage source 104 (e.g. voltage regulator 104-VR) may be kept in the checked configuration. Otherwise, the voltage source setting circuit 802 may set the voltage source (e.g. the voltage regulator 104-VR). For example, the voltage source setting circuit 802 may change the voltage source configuration setting and may perform the same verification. This procedure may be repeated until a voltage source setup (e.g. voltage regulator setup) is found such that the generated Vreg is within the specified range. If no configuration setting is found such that this requirement is satisfied, then the voltage source 104 (e.g. voltage regulator 104-VR) may be declared defective and it may not be capable of being repaired. In other words, the voltage source setting circuit 802 may be configured to repeatedly set the voltage source 104 (e.g. the voltage regulator 104-VR) based on a test result signal provided by the test circuit 302.

The description that follows provides details on how the procedure described above may be implemented by the architecture shown in FIG. 8.

An activated input signal BISR_EN (e.g. set to logic '1') may start the BISR circuit 800. Voltage regulator control signals may be set by the architecture shown in FIG. 8 through signals VregSel<0>$_{BISR}$ and VregSel<1>$_{BISR}$, e.g. if BISR_EN is activated (e.g. set to logic '1'). After configuring the voltage regulator 104-VR, the voltage source setting circuit 802 may activate signal BIST_EN (e.g. set to logic '1'), thus starting test phase for the programmed configuration.

The signal BIST_GO may be obtained from signals FailUB and FailLB. Once signal BIST_END is high (e.g. set to logic '1'), the voltage source setting circuit 802 may check the values of signals FailUB and FailLB. If both signals are deactivated (e.g. set to logic '0'), then the test may pass; otherwise, the voltage source setting circuit 802 may set the voltage source 104 (e.g. reconfigure the voltage regulator 104-VR) and may performs a new test, e.g. by means of the BIST circuit 600.

An activated output signal BISR_END may indicate when the repairing process is finished (e.g. set to logic '1'). Once the process is finished, output signals FailLB_64, FailLB_70, FailLB_74 and FailLB_78 may indicate if Vreg violates the lower bound Vreg_LB when the voltage source 104 (e.g. voltage regulator 104-VR) is configured to generate an expected Vreg at least substantially equal to a plurality of voltages (e.g. about 0.64*$V_{DD}$, 0.70*$V_{DD}$, 0.74*$V_{DD}$ and 0.78*$V_{DD}$, respectively). Similarly, output signals FailUB_64, FailUB_70, FailUB_74 and FailUB_78 may indicate if Vreg violates the upper bound Vreg_UB, e.g. for the corresponding voltage source setup (e.g. voltage regulator setup). An activation (e.g. setting to logic '1') may be asserted on such output signals to indicate violations. At the beginning of the repairing process, such output signals may be activated (e.g. set to logic '1'). Once a given configuration of the voltage regulator is tested, at least one of the corresponding flags may be deactivated (e.g. set to logic '0') (e.g. FailLB_64 and FailUB_64, e.g. when expected Vreg is at least equal to about 0.64*$V_{DD}$).

The voltage source setting circuit 802 may implement a finite state machine (FSM) to control a setting of the voltage source 104 (e.g. the voltage regulator 104-VR) and optionally to control the BIST circuit and/or process output signals of the BIST circuit.

Figure 9:
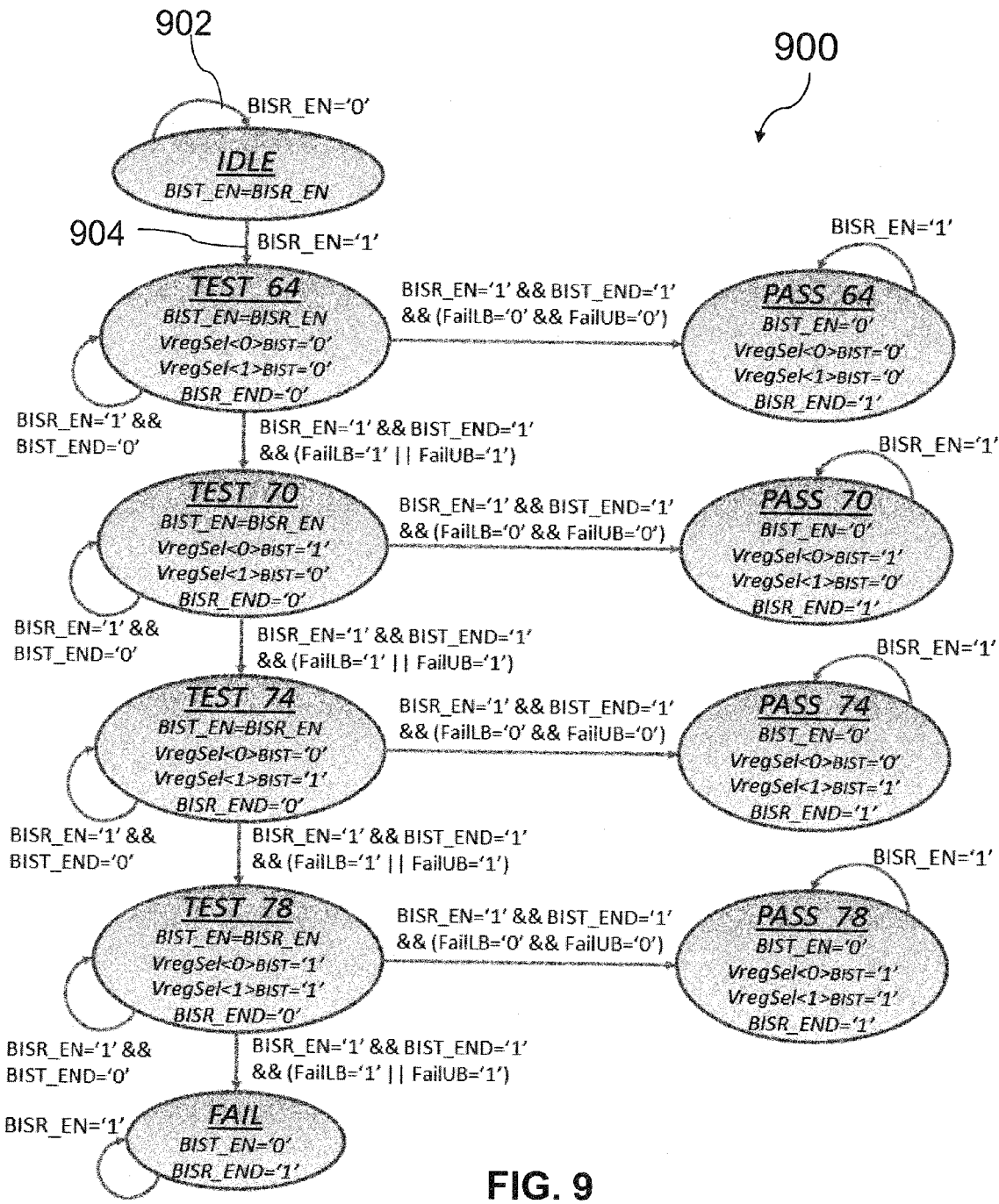
FIG. 9 shows a state transition diagram of a finite state machine (FSM) implemented by a voltage source setting circuit.

FIG. 9 shows a state transition diagram 900 of a finite state machine (FSM) implemented by the voltage source setting circuit 802.

When signal BISR_EN is deactivated (e.g. set to logic '0') (e.g. indicated as arrow 902), the voltage source setting circuit 802 may be in IDLE state (e.g. the BISR circuit 800 may be disabled).

States TEST_64, TEST_70, TEST_74 and TEST_78 may correspond to test phase, through the BIST circuit 600, when the voltage source 104 (e.g. voltage regulator 104-VR) may be configured such that Vreg is expected to be set to about 0.64*$V_{DD}$, 0.70*$V_{DD}$, 0.74*$V_{DD}$ and 0.78*$V_{DD}$, respectively. The test order may be chosen such that configuration settings that supposedly generate lower values of Vreg are tested first, as shown in FIG. 9.

The voltage source setting circuit 802 may switch to states PASS_64, PASS_70, PASS_74 and PASS_78 when the test of the corresponding configuration does not signalize any violation, whereas voltage source setting circuit 802 may be set to FAIL state when test of all available voltage source (e.g voltage regulator) setups fails (e.g. when states TEST_64, TEST_70, TEST_74 and TEST_78 fail).

Once BISR_EN is activated (e.g. set to logic '1') (e.g. indicated as arrow 904), the voltage source setting circuit 802 may be switched from IDLE state to TEST_64 state. The FSM remains in this state until the test is finished, i.e. until BIST_END is activated (e.g. set to logic '1'). If both signals FailLB or FailUB are deactivated (e.g. set to logic '0') at the end of test phase, the repairing process may stop. Otherwise, if signal FailLB or FailUB is activated (e.g. set to logic '1'), which may mean that a violation has been detected, then the next voltage source configuration setting may be tested.

As shown in FIG. 9, the FSM implemented by the voltage source setting circuit 802 may stop on the first configuration that may generate a Vreg that is within range [Vreg_LB, Vreg_UB]. In this case, the BIST circuit 600 may be shut off. As shown in FIG. 9, the signal BIST_GO may be deactivated (e.g. set to logic '0') once a violation is detected during the test phase. This may switch the control circuit 602 to INIT state, which may initialize the at least one test memory cell 302 for the next test.

Furthermore, it may be noted that if the BISR circuit 800 may be kept enabled, the voltage source setup (e.g. voltage regulator setup) for which the test passes is indicated as signals VregSel$_{BISR}$<0> and VregSel$_{BISR}$<1>, and these may be used afterwards. When BISR_EN is deactivated (e.g. set to logic '0'), the voltage source setting circuit 802 may switch to IDLE state, regardless of the current state. Such transitions have been omitted from FIG. 9 for simplicity.

Experiments may be performed to test the BIST circuit 600 shown in FIG. 6, and the BISR circuit 800 shown in FIG. 8. The description that follows provides details of the experiments performed on the BIST circuit 600 and the BISR circuit 800.

The BIST circuit 600 and the BISR circuit 800 may be embedded in an experimental memory array cell 102 (e.g. low-power SRAM array cell), which may be designed with a 40 nm process technology. The nominal supply voltage $V_{DD}$ may be about 1.1V for the 40 nm process technology. The memory array cell 102 may have a reference 4K×64 memory block (4K words of 64 bits), organized as a core-cell array of 6T core-cells composed of 512 bit lines and 512 word lines.

Each of the BIST and BISR circuits may have 6 flip-flops, 8 latches, 170 logic gates, 2 test memory cells and 2 failure detection circuits. It may be noted that the area of the BIST circuit 600 and the BISR circuit 800 may be negligible compared to the area of the memory cell array 102, which may include 256K memory cells.

The experiments performed may execute a complete set of electrical simulations to evaluate the effectiveness of the proposed test and repair mechanisms (e.g. in respect of BIST circuit 600 and the BISR circuit 800). To choose appropriate values for Vreg_LB and Vreg_UB, which define $DRV_1$ of the at least one test memory cell 302, static power consumption in DS mode were quantified when varying the voltage level at the internal supply line $V_{DD}$_CC of the memory cell array 102 in the range [0.6V, 1.1V]. To perform this study, the voltage regulator 104-VR of the voltage source 104 was removed, and the voltage at $V_{DD}$_CC was set using an independent voltage source.

An amount of 1.2 µA was considered for current consumption by the voltage regulator 104-VR, which may correspond to the maximum budget specified for the voltage regulator 104-VR. The experiments performed also included the memory peripheral circuit 202, which was turned off in order to reproduce the actual scenario where the memory (e.g. SRAM) is in DS mode.

Electrical simulations were performed to measure static power consumption of the memory (e.g. SRAM) in the scenarios described above. In such simulations, a complete set of process corners (slow, typical, fast, fast NMOS/slow PMOS, slow NMOS/fast PMOS) were considered. The obtained data may be compared to the static power consumption when the memory (e.g. SRAM) may not be performing operations in ACT mode, e.g. considering $V_{DD}$ set to the nominal level of about 1.1V.

Figure 10:
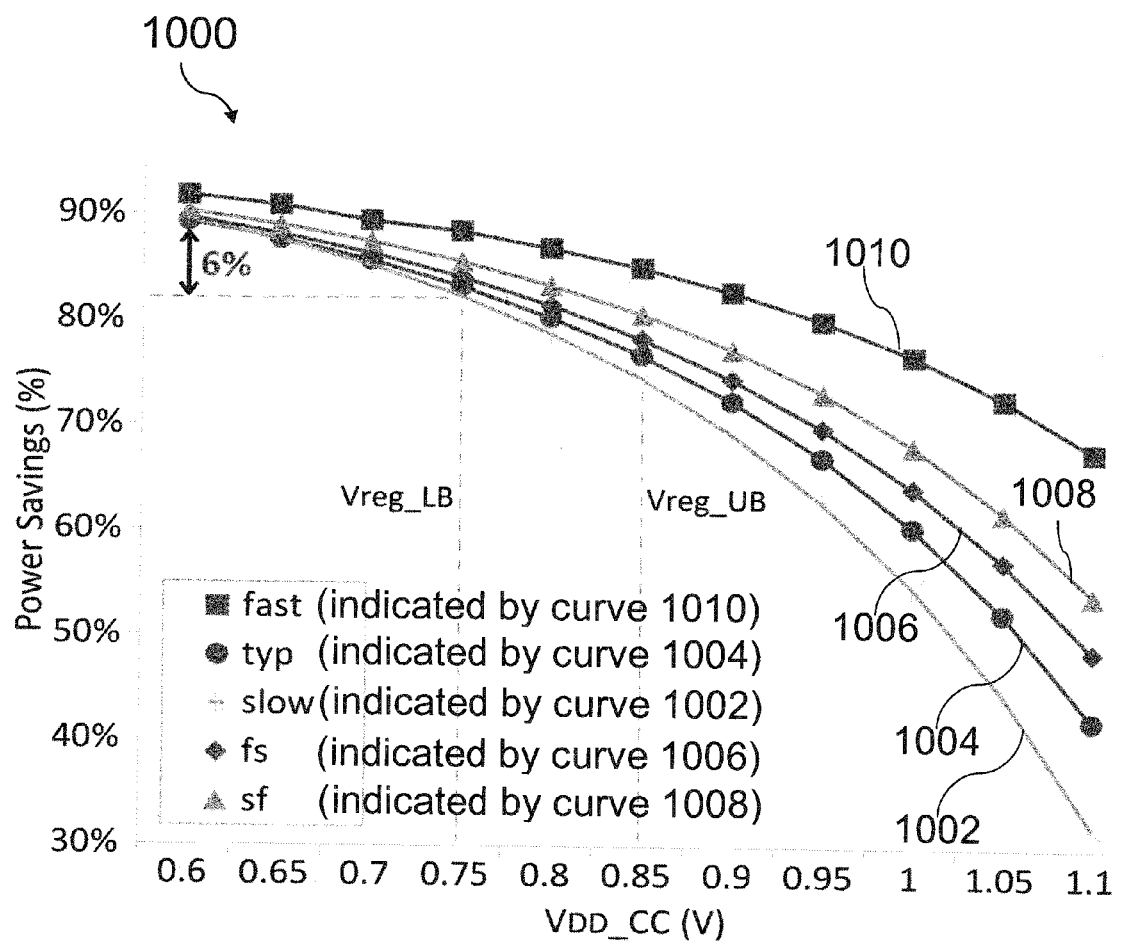
FIG. 10 shows simulation results that summarize power savings achieved in a deep-sleep mode when varying the supply voltage of a memory cell array in the range from about 0.6V to about 1.1V at room temperature.

FIG. 10 shows simulation results 1000 that summarize power savings achieved in DS mode when varying the supply voltage of the memory cell array 102 in the range [0.6V, 1.1V] at room temperature (e.g. about 25° C.).

Studies performed with threshold voltage variations affecting switches (e.g. transistors) of memory cells of the memory cell array 102 (e.g. SRAM cell array) have shown that the worst-case DRV of memory cells may be over 730 mV. Thus, a voltage of about 0.75V may be an available configuration for Vreg_LB that is close to (but not less than) 730 mV.

In order to validate the voltage of about 0.75V as Vreg_LB, it was verified that the maximum WUT specified for the memory cell array 102 is not exceeded when Vreg is set to about 0.75V, in DS mode. Furthermore, it may be observed in FIG. 10 that a lowering $V_{DD}$_CC from about 0.75V to about 0.6V may increases static power savings up to about 6%, in the best case (e.g. for process corner slow indicated by curve 1002). Therefore, it may be concluded that no significant increase in static power savings may be achieved when reducing $V_{DD}$_CC beyond about 0.75V, in DS mode. Based on this analysis, a voltage of about 0.75V was chosen for parameter Vreg_LB.

Parameter Vreg_UB may be chosen such that static power consumption savings achieved with Vreg set to about 0.75V is not reduced more than about 10%. This may ensure that the maximum budget for static power consumption in the memory cell array 102 in DS mode may be still respected. According to FIG. 10, Vreg equaling about 0.85V may satisfy this requirement, hence such a voltage level may be chosen for parameter Vreg_UB.

After choosing the range [Vreg_LB, Vreg_UB], resistive-open defects may be injected in the voltage regulator 104-VR and the electrical simulations may be performed in the presence of such defects to evaluate the effectiveness of the BIST circuit 600 and the BISR circuit 800. The purpose of the injected defects may be to create scenarios to evaluate the proposed test and repair techniques.

Figure 11:
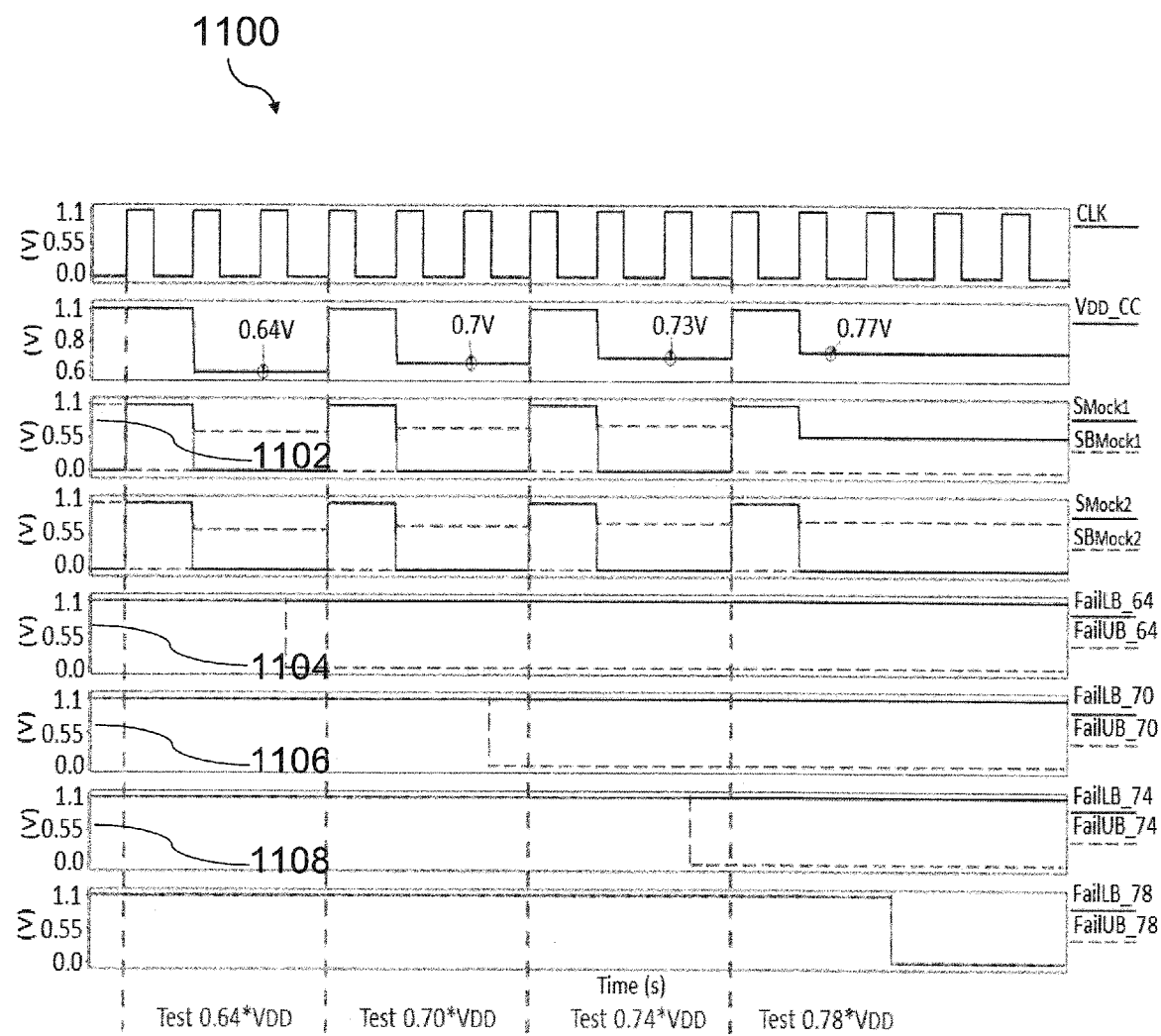
FIG. 11 shows simulation results for test and repair processes when a voltage regulator is affected by a defect injected in series with its supply line.

FIG. 11 shows simulation results 1100 for test and repair processes when the voltage regulator 104-VR is affected by a defect injected in series with its supply line. Such a defect may cause a negative offset on the expected regulated voltage.

The nominal supply voltage $V_{DD}$ may be about 1.1V in the example shown in FIG. 11. As shown in FIG. 11, the first three voltage regulator configuration settings may fail to generate a Vreg that is in the range [0.75V, 0.85V]. Such configurations may generate a Vreg that may be lower than the lower bound 0.75V, thus DRFs are observed in the at least one test memory cell 302*a* (e.g. in the first test memory cell 302*a*-1) (indicated by graph 1102 showing signals $S_{Mock1}$ and $SB_{Mock1}$ in FIG. 11).

A voltage regulator setup that generates an expected Vreg that equals to about 0.78*$V_{DD}$ may be the configuration that passes the test. In this case, Vreg may be over about 0.77V, which may be within the range [0.75V, 0.85V]. A Vreg that may equal to about 0.77V may not cause a DRF in the first test memory cell 302*a*-1 and may cause a DRF in the second test memory cell 302*a*-2, as expected. It may be noted that in a defect-free circuit, a configuration that generates a Vreg that may equal to about 0.70*$V_{DD}$ (e.g. about 0.77V, for $V_{DD}$=1.1V) would be the first to generate a regulated voltage that is within range [0.75V, 0.85V]. Accordingly, it is noted that even though the voltage regulator 104-VR may be defective, the proposed method could find a voltage regulator configuration setting such that the generated voltage does not violate the specified range.

As shown in FIG. 11, three clock cycles may be needed to test each voltage regulator setup. In the first cycle, the at least one test memory cell may be initialized, with the memory (e.g. SRAM) in ACT mode. In the second cycle, the memory (e.g. SRAM) may be switched to DS mode, such that the corresponding voltage regulator configuration is tested. In the third clock cycle, the BIST circuit 600 shown in FIG. 8 may report test results to the voltage source setting circuit 802 shown in FIG. 8, which may define a setting of the voltage source 104 based on the test result provided by the BIST circuit 600.

It may be observed in FIG. 11 that output signals FailLB_64 (indicated by graph 1104), FailLB_70 (indicated by graph 1106) and FailLB_74 (indicated by graph 1108) may be activated (e.g. set to logic '1') at the end of test and repair processes, which may indicate that the corresponding configurations violate the lower bound of about 0.75V. However, output signals that indicate violations on the upper bound Vreg_UB may be inactivated (e.g. set to logic '0'), e.g. since a voltage level of about 0.85V may not be exceeded. Such output signals can be used to create digital signatures, which can be exploited for diagnosis purposes.

Figure 12:
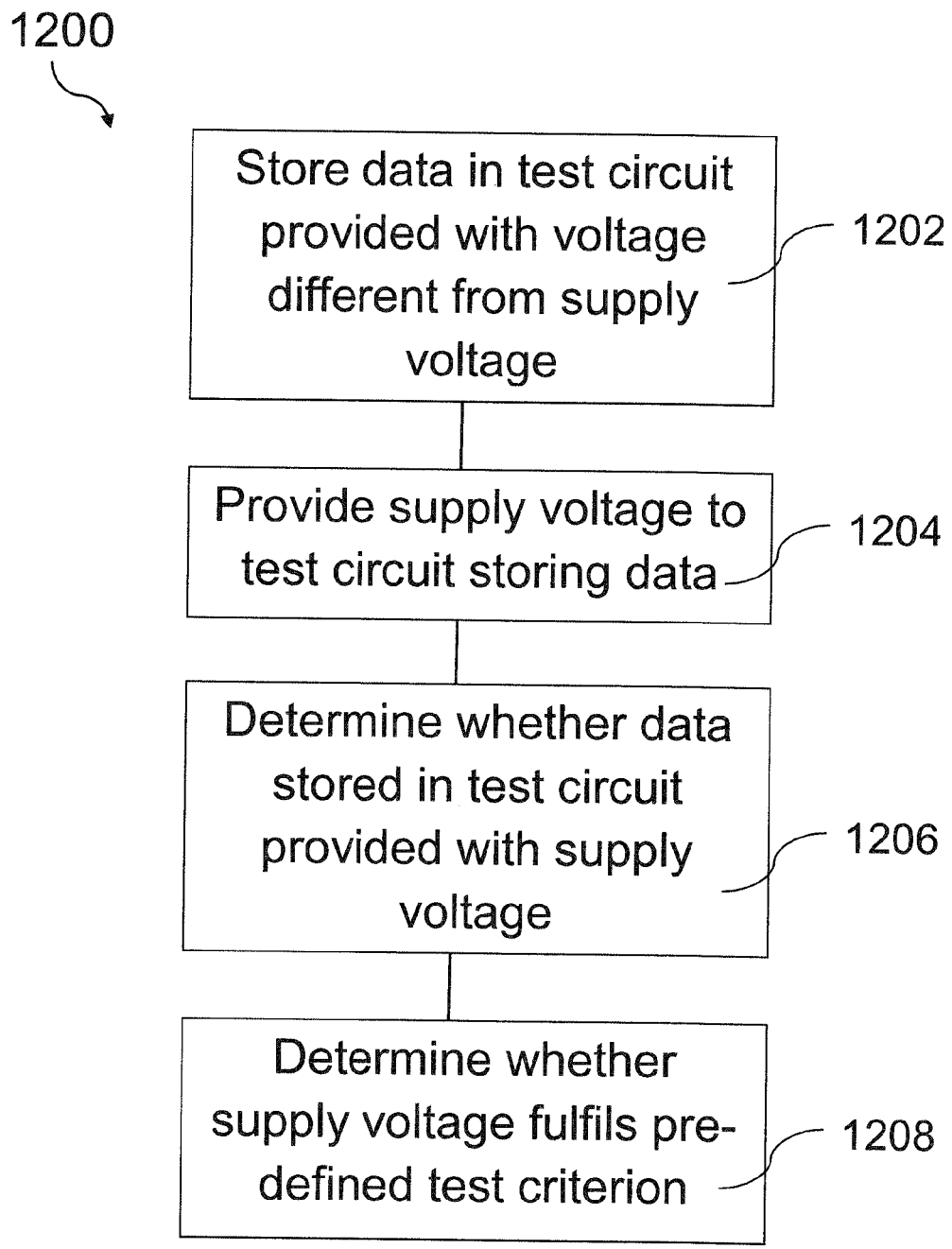
FIG. 12 shows a method for testing a supply voltage provided to a test circuit.

FIG. 12 shows a method 1200 for testing a supply voltage provided to a test circuit.

The method 1200 may, for example, be identified with the the state transition diagram shown in FIG. 7 which shows a finite state machine (FSM) implemented by the control circuit 602.

The method 1200 may include: storing data in the test circuit provided with a voltage different from the supply voltages provided during test phase (in 1202); providing the supply voltage to the test circuit storing the data (in 1204); determining whether the data is stored in the test circuit provided with the supply voltage (in 1206); and determining whether the supply voltage fulfils a pre-defined test criterion (in 1208).

The pre-defined test criterion may based on a first voltage level and a second voltage level different from the first voltage level. For example, the first voltage level may include a lower bound of the supply voltage, and the second voltage level may include an upper bound of the supply voltage.

Figure 13:
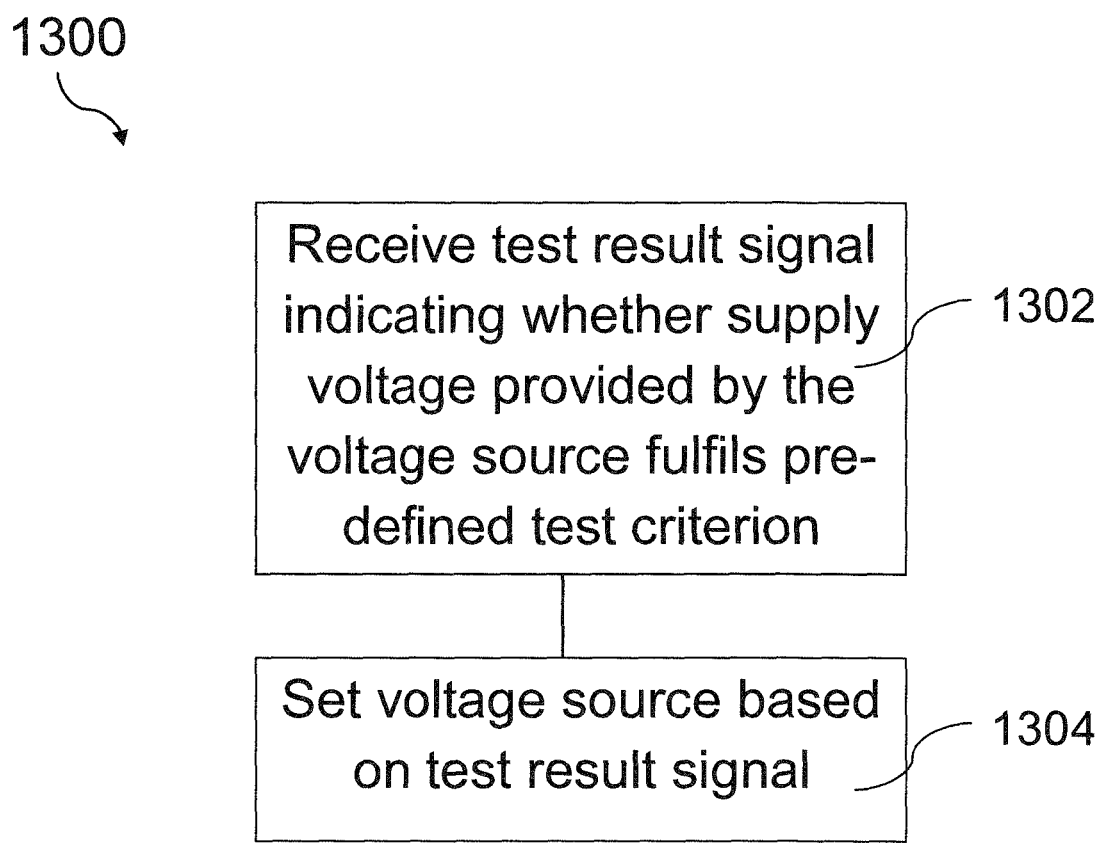
FIG. 13 shows a method for repairing a voltage source.

FIG. 13 shows a method 1300 for repairing a voltage source.

The method 1300 may, for example, be identified with the state transition diagram 900 shown in FIG. 9, which shows a finite state machine (FSM) implemented by the voltage source setting circuit 802.

The method 1300 may include: receiving a test result signal indicating whether a supply voltage provided by the voltage source fulfils a pre-defined test criterion (in 1302); and setting the voltage source based on the test result signal (in 1304).

For example, setting the voltage source may include repeatedly setting the voltage source based on the test result signal.

According to various examples described herein, a circuit arrangement may be provided. The circuit arrangement may include: a memory having a memory cell array including a plurality of memory cells; a voltage source configured to provide at least one supply voltage; a test circuit (e.g. monolithically) integrated with the memory cell array and the voltage source, wherein the test circuit receives the supply voltage; the test circuit including: at least one test memory cell; at least one failure detection circuit configured to detect a data retention failure in the at least one test memory cell.

The test circuit may further include: a data retention stability tuning circuit configured to tune the data retention stability of the at least one test memory cell.

The data retention stability tuning circuit may include a variable resistor.

The voltage source may be configured to provide a first supply voltage and a second supply voltage.

The memory may further include a memory peripheral circuit configured to provide access to the memory cell array. The circuit arrangement may further include a first switching structure coupled between the voltage source and the memory cell array and configured to provide the first supply voltage to the memory cell array; a second switching structure coupled between the voltage source and the memory peripheral circuit and configured to provide the second supply voltage to the memory peripheral circuit.

The voltage source may include a voltage regulator.

The at least one test memory cell may include a first test memory cell and a second test memory cell; wherein the at least one failure detection circuit may include a first failure detection circuit configured to detect a data retention failure in the first test memory cell and a second failure detection circuit configured to detect a data retention failure in the second test memory cell.

The test circuit may further include a data retention stability tuning circuit configured to tune the data retention stability of the at least one test memory cell; wherein the data retention stability tuning circuit and the first test memory cell and provide the data retention stability of the first test memory cell, and wherein the data retention stability tuning circuit and the second test memory cell provide the data retention stability of the second test memory cell different from the data retention stability of the first test memory cell.

The data retention stability tuning circuit and the first test memory cell may provide a data retention stability of the first test memory cell at a first pre-defined supply voltage; and wherein the data retention stability tuning circuit and the second test memory cell may provide a data retention stability of the second test memory cell at a second pre-defined supply voltage different from the first pre-defined supply voltage.

The at least one test memory cell may have a lower data retention stability than the plurality of memory cells of the memory cell array.

The plurality of memory cells may include a volatile memory cell.

The volatile memory cell may include a random access memory cell.

The random access memory cell may include a static random access memory cell.

The plurality of memory cells may include a non-volatile memory cell.

The test circuit may include a control circuit configured to control a test of the voltage source.

The control circuit may implement a finite state machine to control the test of the voltage source.

The circuit arrangement may further include a voltage source setting circuit configured to set the voltage source.

The voltage source setting circuit may be configured to repeatedly set the voltage source based on a test result signal provided by the test circuit.

According to various examples described here, a circuit arrangement may be provided. The circuit arrangement may include: a memory having a memory cell array including a plurality of memory cells; a voltage source configured to provide at least one supply voltage; a test circuit (e.g. monolithically) integrated with the memory cell array and the voltage source, wherein the test circuit receives the supply voltage; the test circuit configured to determine whether the at least one test memory cell fulfils a pre-defined test criterion.

The pre-defined test criterion may be based on a first voltage level and a second voltage level different from the first voltage level.

The first voltage level may include a lower bound of the supply voltage, and wherein the second voltage level may include an upper bound of the supply voltage.

According to various examples described herein, a method for testing a supply voltage provided to a test circuit may be provided. The method may include: storing data in the test circuit provided with a voltage different from the supply voltage; providing the supply voltage to the test circuit storing the data; determining whether the data is stored in the test circuit provided with the supply voltage; and determining whether the supply voltage fulfills a pre-defined test criterion.

The pre-defined test criterion may be based on a first voltage level and a second voltage level different from the first voltage level.

The first voltage level may include a lower bound of the supply voltage, and wherein the second voltage level may include an upper bound of the supply voltage.

According to various examples described herein, a method for repairing a voltage source. The method may include: receiving a test result signal indicating whether a supply voltage provided by the voltage source fulfills a pre-defined test criterion; and setting the voltage source based on the test result signal.

Setting the voltage source may include repeatedly setting the voltage source based on the test result signal.

Various examples and aspects described in the context of one of the devices or methods described herein may be analogously valid for the other devices or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A circuit arrangement, comprising:
   a memory comprising a memory cell array comprising a plurality of memory cells;
   a voltage source configured to provide at least one supply voltage;
   a test circuit integrated with the memory cell array and the voltage source, wherein the test circuit receives the supply voltage;
   the test circuit comprising:
     at least one test memory cell,
     wherein the at least one test memory cell comprises a first test memory cell corresponding to a lower bound of the supply voltage and a second test memory cell corresponding to an upper bound of the supply voltage;
     at least one failure detection circuit configured to detect a data retention failure in the at least one test memory cell;
     wherein the at least one failure detection circuit comprises a first failure detection circuit configured to detect a data retention failure in the first test memory cell corresponding to the lower bound of the supply voltage and a second failure detection circuit configured to detect a data retention failure in the second test memory cell corresponding to the upper bound of the supply voltage.

2. The circuit arrangement of claim 1, the test circuit further comprising:
a data retention stability tuning circuit configured to tune a data retention stability of the at least one test memory cell.

3. The circuit arrangement of claim 1, wherein the voltage source is configured to provide a first supply voltage and a second supply voltage.

4. The circuit arrangement of claim 3, the memory further comprising a memory peripheral circuit configured to provide access to the memory cell array;
the circuit arrangement further comprising:
a first switching structure coupled between the voltage source and the memory cell array and configured to provide the first supply voltage to the memory cell array;
a second switching structure coupled between the voltage source and the memory peripheral circuit and configured to provide the second supply voltage to the memory peripheral circuit.

5. The circuit arrangement of claim 1, wherein the voltage source comprises a voltage regulator.

6. The circuit arrangement of claim 1, the test circuit further comprising a data retention stability tuning circuit configured to tune the data retention stability of the at least one test memory cell;
wherein the data retention stability tuning circuit and the first test memory cell provide the data retention stability of the first test memory cell, and wherein the data retention stability tuning circuit and the second test memory cell provide the data retention stability of the second test memory cell different from the data retention stability of the first test memory cell.

7. The circuit arrangement of claim 1, wherein the data retention stability tuning circuit and the first test memory cell provide a data retention stability of the first test memory cell at a first pre-defined supply voltage; and
wherein the data retention stability tuning circuit and the second test memory cell provide a data retention stability of the second test memory cell at a second pre-defined supply voltage different from the first pre-defined supply voltage.

8. The circuit arrangement of claim 1, wherein the at least one test memory cell has a lower data retention stability than the plurality of memory cells of the memory cell array.

9. The circuit arrangement of claim 1, wherein the plurality of memory cells comprises a volatile memory cell.

10. The circuit arrangement of claim 9, wherein the random access memory cell comprises a static random access memory cell.

11. The circuit arrangement of claim 1, wherein the test circuit comprises a control circuit configured to control a test of the voltage source.

12. The circuit arrangement of claim 11, wherein the control circuit implements a finite state machine to control the test of the voltage source.

13. The circuit arrangement of claim 1, further comprising:
a voltage source setting circuit configured to set the voltage source.

14. The circuit arrangement of claim 13, wherein the voltage source setting circuit is configured to repeatedly set the voltage source based on a test result signal provided by the test circuit.

15. A circuit arrangement, comprising:
a memory comprising a memory cell array comprising a plurality of memory cells;
a voltage source configured to provide at least one supply voltage;
a test circuit comprising a first test memory cell and a second test memory cell integrated with the memory cell array and the voltage source, wherein the test circuit receives the supply voltage;
the test circuit configured to determine whether the first and the second test memory cells fulfill a pre-defined test criterion;
wherein the pre-defined test criterion is based on a first voltage level tested in the first test memory cell and a second voltage level tested in the second test memory cell different from the first voltage level; and
wherein the first voltage level comprises a lower bound of the supply voltage, and wherein the second voltage level comprises an upper bound of the supply voltage.

16. A method for testing a supply voltage provided to a test circuit, the method comprising:
storing data in the test circuit comprising a first test memory cell and a second test memory cell provided with a voltage different from the supply voltage;
providing the supply voltage to the test circuit storing the data;
determining whether the data is stored in the test circuit provided with the supply voltage; and
determining whether the supply voltage fulfills a pre-defined test criterion.

17. The method of claim 16, wherein the pre-defined test criterion is based on a first voltage level and a second voltage level different from the first voltage level.

* * * * *